United States Patent
Yan et al.

(10) Patent No.: US 8,780,651 B2
(45) Date of Patent: Jul. 15, 2014

(54) CONTINUOUS PROGRAMMING OF NON-VOLATILE MEMORY

(75) Inventors: Tianhong Yan, San Jose, CA (US); Luca Fasoli, Campbell, CA (US)

(73) Assignee: SanDisk 3D LLC, Milpitas, CA (US)

(*) Notice: Subject to any disclaimer, the term of this patent is extended or adjusted under 35 U.S.C. 154(b) by 0 days.

(21) Appl. No.: 13/537,029

(22) Filed: Jun. 28, 2012

(65) Prior Publication Data
US 2012/0287734 A1    Nov. 15, 2012

Related U.S. Application Data

(63) Continuation of application No. 13/217,235, filed on Aug. 24, 2011, now Pat. No. 8,238,174, which is a continuation of application No. 12/563,140, filed on Sep. 20, 2009, now Pat. No. 8,027,209.

(60) Provisional application No. 61/171,022, filed on Apr. 20, 2009, provisional application No. 61/103,180, filed on Oct. 6, 2008.

(51) Int. Cl.
*G11C 7/22* (2006.01)
*G11C 7/10* (2006.01)

(52) U.S. Cl.
CPC .................. *G11C 7/1078* (2013.01)
USPC ............ 365/189.16; 365/230.03; 365/230.06; 365/205; 365/196; 365/207

(58) Field of Classification Search
CPC ....... G11C 7/1078; G11C 7/22; G11C 7/1072
USPC .......... 365/189.16, 230.03, 230.06, 205, 196, 365/207, 231
See application file for complete search history.

(56) References Cited

U.S. PATENT DOCUMENTS

| | | | |
|---|---|---|---|
| 5,315,541 A | 5/1994 | Harari | |
| 5,623,436 A | 4/1997 | Sowards | |

(Continued)

FOREIGN PATENT DOCUMENTS

| | | | |
|---|---|---|---|
| CN | 1620699 | 5/2005 | |
| CN | 1759482 | 4/2006 | |

(Continued)

OTHER PUBLICATIONS

U.S. Appl. No. 13/601,869, filed Aug. 31, 2012.

(Continued)

*Primary Examiner* — Thong Q Le
(74) *Attorney, Agent, or Firm* — Vierra Magen Marcus LLP

(57) ABSTRACT

A system connects a signal driver to a first control line that is connected to a first non-volatile storage element, charges the first control line while the signal driver is connected to the first control line, disconnects the signal driver from the first control line while the first control line remains charged from the signal driver, connects the signal driver to a second control line that is connected to a second non-volatile storage element, charges the second control line using the signal driver while the signal driver is connected to the second control line, and disconnects the signal driver from the second control line. The disconnecting of the signal driver from the first control line, the connecting the signal driver to the second control line and the charging of the second control line are performed without waiting for the first non-volatile storage element's program operation to complete.

18 Claims, 15 Drawing Sheets

Side B

(56) References Cited

U.S. PATENT DOCUMENTS

| | | |
|---|---|---|
| 5,712,815 A | 1/1998 | Bill |
| 5,742,787 A | 4/1998 | Talreja |
| 5,812,457 A | 9/1998 | Arase |
| 5,835,396 A | 11/1998 | Zhang |
| 5,841,696 A | 11/1998 | Chen |
| 5,847,998 A | 12/1998 | Van Buskirk |
| 5,894,437 A | 4/1999 | Pellegrini |
| 5,912,839 A | 6/1999 | Ovshinsky |
| 5,963,465 A | 10/1999 | Eitan |
| 6,034,882 A | 3/2000 | Johnson |
| 6,091,633 A | 7/2000 | Cernea |
| 6,141,241 A | 10/2000 | Ovshinsky |
| 6,141,253 A | 10/2000 | Lin |
| 6,144,585 A | 11/2000 | Hazama |
| 6,201,739 B1 | 3/2001 | Brown |
| 6,243,290 B1 | 6/2001 | Kurata |
| 6,282,117 B1 | 8/2001 | Tanaka |
| 6,292,048 B1 | 9/2001 | Li |
| 6,301,161 B1 | 10/2001 | Holzmann |
| 6,307,785 B1 | 10/2001 | Takeuchi |
| 6,331,943 B1 | 12/2001 | Naji |
| 6,333,881 B1 | 12/2001 | Kusunoki |
| 6,420,215 B1 | 7/2002 | Knall |
| 6,426,893 B1 | 7/2002 | Conley |
| 6,473,332 B1 | 10/2002 | Ignaliev |
| 6,525,953 B1 | 2/2003 | Johnson |
| 6,529,409 B1 | 3/2003 | Nguyen |
| 6,529,410 B1 | 3/2003 | Han |
| 6,532,172 B2 | 3/2003 | Harari |
| 6,542,428 B2 | 4/2003 | Hidaka |
| 6,574,145 B2 | 6/2003 | Kleveland |
| 6,614,688 B2 | 9/2003 | Jeong |
| 6,856,541 B2 | 2/2005 | Cernea |
| 6,856,572 B2 | 2/2005 | Scheuerlein |
| 6,871,257 B2 | 3/2005 | Conley |
| 6,879,505 B2 | 4/2005 | Scheuerlein |
| 6,937,510 B2 | 8/2005 | Hosono |
| 6,951,780 B1 | 10/2005 | Herner |
| 6,952,030 B2 | 10/2005 | Herner |
| 6,952,043 B2 | 10/2005 | Vyvoda |
| 7,042,765 B2 | 5/2006 | Sibigtroth |
| 7,068,538 B2 | 6/2006 | Devin |
| 7,068,539 B2 | 6/2006 | Guterman |
| 7,081,377 B2 | 7/2006 | Cleeves |
| 7,126,841 B2 | 10/2006 | Rinerson |
| 7,286,439 B2 | 10/2007 | Fasoli |
| 7,301,839 B2 | 11/2007 | Li |
| 7,307,884 B2 | 12/2007 | Guterman |
| 7,359,279 B2 | 4/2008 | Fasoli |
| 7,362,604 B2 | 4/2008 | Scheuerlein |
| 7,369,428 B2 | 5/2008 | Jeong |
| 7,391,638 B2 | 6/2008 | Fasoli |
| 7,420,850 B2 | 9/2008 | Fasoli |
| 7,447,075 B2 | 11/2008 | Guterman |
| 7,453,730 B2 | 11/2008 | Guterman |
| 7,869,258 B2 | 1/2011 | Scheuerlein |
| 7,978,507 B2 | 7/2011 | Scheuerlein |
| 8,130,528 B2 | 3/2012 | Yan |
| 2002/0057598 A1 | 5/2002 | Sakamoto |
| 2002/0071312 A1 | 6/2002 | Tanaka |
| 2003/0117831 A1 | 6/2003 | Hush |
| 2003/0193566 A1* | 10/2003 | Matsuda et al. ............ 348/189 |
| 2004/0032788 A1 | 2/2004 | Sakui |
| 2004/0036103 A1 | 2/2004 | Chen |
| 2004/0124466 A1 | 7/2004 | Walker |
| 2004/0202028 A1 | 10/2004 | Cioaca |
| 2005/0162898 A1 | 7/2005 | Nejad |
| 2005/0162908 A1 | 7/2005 | Kato |
| 2006/0062043 A1 | 3/2006 | Kund et al. |
| 2006/0133145 A1 | 6/2006 | Park |
| 2006/0250836 A1* | 11/2006 | Herner et al. ............ 365/148 |
| 2006/0291291 A1 | 12/2006 | Hosono |
| 2007/0076479 A1 | 4/2007 | Kim |
| 2007/0091680 A1 | 4/2007 | Conley |
| 2007/0190722 A1 | 8/2007 | Herner |
| 2007/0285971 A1 | 12/2007 | Toda |
| 2008/0025132 A1 | 1/2008 | Fasoli |
| 2008/0062739 A1 | 3/2008 | Bill |
| 2008/0151601 A1 | 6/2008 | Kang |
| 2008/0151637 A1 | 6/2008 | Doyle |
| 2008/0316798 A1 | 12/2008 | Tanizaki |
| 2009/0116280 A1 | 5/2009 | Parkinson |
| 2009/0323392 A1 | 12/2009 | Fasoli |
| 2009/0323393 A1 | 12/2009 | Scheuerlein |
| 2010/0085822 A1 | 4/2010 | Yan |
| 2010/0259960 A1 | 10/2010 | Samachisa |
| 2010/0265750 A1 | 10/2010 | Yan |
| 2011/0075468 A1 | 3/2011 | Scheuerlein |

FOREIGN PATENT DOCUMENTS

| | | |
|---|---|---|
| CN | 101189679 | 5/2008 |
| GB | 2434901 | 8/2007 |
| WO | WO9808225 | 2/1998 |
| WO | WO2008030351 | 3/2008 |

OTHER PUBLICATIONS

Office Action dated Dec. 21, 2012, U.S. Appl. No. 13/601,869, filed Aug. 31, 2012.
Response to Office Action dated Mar. 22, 2013, U.S. Appl. No. 13/601,869, filed Aug. 31, 2012.
Office Action dated Feb. 28, 2013, U.S. Appl. No. 13/479,145, filed May 23, 2012.
Office Action dated Feb. 23, 2011, U.S. Appl. No. 12/563,140.
Response to Office Action dated May 16, 2011, U.S. Appl. 12/563,140.
Notice of Allowance dated May 27, 2011, U.S. Appl. No. 12/563,140.
International Search Report dated Dec. 8, 2009 in PCT Application No. PCT/US2009/058890.
Written Opinion of the International Searching Authority dated Dec. 8, 2009 in PCT Application No. PCT/US2009/058890.
International Search Report dated Dec. 4, 2009 in PCT Application No. PCT/US2009/058889.
Written Opinion of the International Searching Authority dated Dec. 4, 2009 in PCT Application No. PCT/US2009/058889.
Office Action dated Mar. 22, 2011, U.S. Appl. No. 12/339,338.
U.S. Appl. No. 13/154,795, filed Jun. 7, 2011.
Office Action dated Sep. 14, 2011, U.S. Appl. No. 12/563,139.
Response to the Written Opinion dated Nov. 28, 2011, EP Patent Application No. 09737244.5.
Response to Office Action dated Jan. 11, 2012, U.S. Appl. No. 12/563,139.
Office Action dated Mar. 23, 2012, U.S. Appl. No. 12/563,139.
Response to Office Action dated May 18, 2012, U.S. Appl. No. 12/563,139.
Notice of Allowance dated Jun. 4, 2012, U.S. Appl. No. 12/563,139.
Office Action dated Dec. 16, 2011, U.S. Appl. No. 13/217,235.
Response to Office Action dated Mar. 15, 2012, U.S. Appl. No. 13/217,235.
Notice of Allowance dated Mar. 29, 2012, U.S. Appl. No. 13/217,235.
Chinese Office Action dated May 24, 2013, Chinese Patent Application No. 200980139725.6.
Japanese Office Action dated Jun. 25, 2013, Japanese Patent Application No. 2011-530151.
English Translation of Abstract of Chinese Patent Application No. CN101189679, Jul. 10, 2013.
English Translation of Abstract of Chinese Patent Application No. CN1759482, Jul. 10, 2013.
English Translation of Abstract of Chinese Patent Application No. CN1620699, Jul. 10, 2013.
Office Action dated May 31, 2013, U.S. Appl. No. 13/601,869, filed Aug. 31, 2012.
Response to Office Action dated Jun. 27, 2013, U.S. Appl. No. 13/479,145, filed May 23, 2012.
Notice of Allowance dated Sep. 17, 2013, U.S. Appl. No. 13/479,145, filed May 23, 2012.

(56) References Cited

OTHER PUBLICATIONS

Chinese Response to Office Action dated Oct. 8, 2013, Chinese Patent Application No. 200980139725.6.
Chinese Office Action dated Oct. 29, 2013, Chinese Patent Application No. 200980158609.9.
Response to Office Action dated Nov. 1, 2013, U.S. Appl. No. 13/601,869.
Notice of allowance dated Dec. 9, 2013, U.S. Appl. No. 13/601,869.
European Office Action dated Nov. 28, 2013, European Patent Application No. 09737244.5.
Response to European Office Action dated Apr. 1, 2014, Europeam Patent Patent Application No. 09737244.5.
Chinese Office Action dated Feb. 12, 2014, Chinese Patent Patent Application No. 200980139725.6.

* cited by examiner

US 8,780,651 B2

CONTINUOUS PROGRAMMING OF NON-VOLATILE MEMORY

CLAIM OF PRIORITY

This application is a continuation application of U.S. patent application Ser. No. 13/217,235, Continuous Programming of Non-Volatile Memory, filed Aug. 24, 2011, which is a continuation application of U.S. patent application Ser. No. 12/563,140, Continuous Programming of Non-Volatile Memory, filed Sep. 20, 2009, which claims the benefit of U.S. Provisional Application No. 61/171,022, "Data Dependent Data-Line Switching Scheme," by Thomas Yan and Luca Fasoli, filed on Apr. 20, 2009; and Provisional Application No. 61/103,180, "Set Scheme For Memory System," by Thomas Yan, Luca Fasoli, Roy Scheuerlein and Jeffrey Koonyee Lee, filed on Oct. 6, 2008, all of which are incorporated herein by reference in their entirety.

BACKGROUND

1. Field

The present invention relates to technology for non-volatile data storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, consumers generally want the semiconductor memory to perform at sufficient speeds so that the memory does not slow down operation of the electronic device.

DETAILED DESCRIPTION

A non-volatile storage system is disclosed that can perform continuous programming. The non-volatile storage system includes a plurality of non-volatile storage elements, a set of signal driving circuits, and selection circuitry. The selection circuitry selectively connects either a first set of the non-volatile storage elements to the set of signal driving circuits or a second set of the non-volatile storage elements to the set of signal driving circuits. The set of signal driving circuits, which in one embodiment includes sense amplifiers, start a program operation for the first set of non-volatile storage elements while the selection circuitry connects the first set of non-volatile storage elements to the set of signal driving circuits. The selection circuitry disconnects the first set of non-volatile storage elements from the set of signal driving circuits and connects the second set of non-volatile storage elements to the set of signal driving circuits after starting the program operation for the first set of non-volatile storage elements and without waiting for completion of the program operation for the first set of non-volatile storage elements. The set of signal driving circuits start a program operation for the second set of non-volatile storage elements while the selection circuitry connects the second set of non-volatile storage elements to the set of signal driving circuits without waiting for completion of the program operation for the first set of non-volatile storage element.

Figure 1:
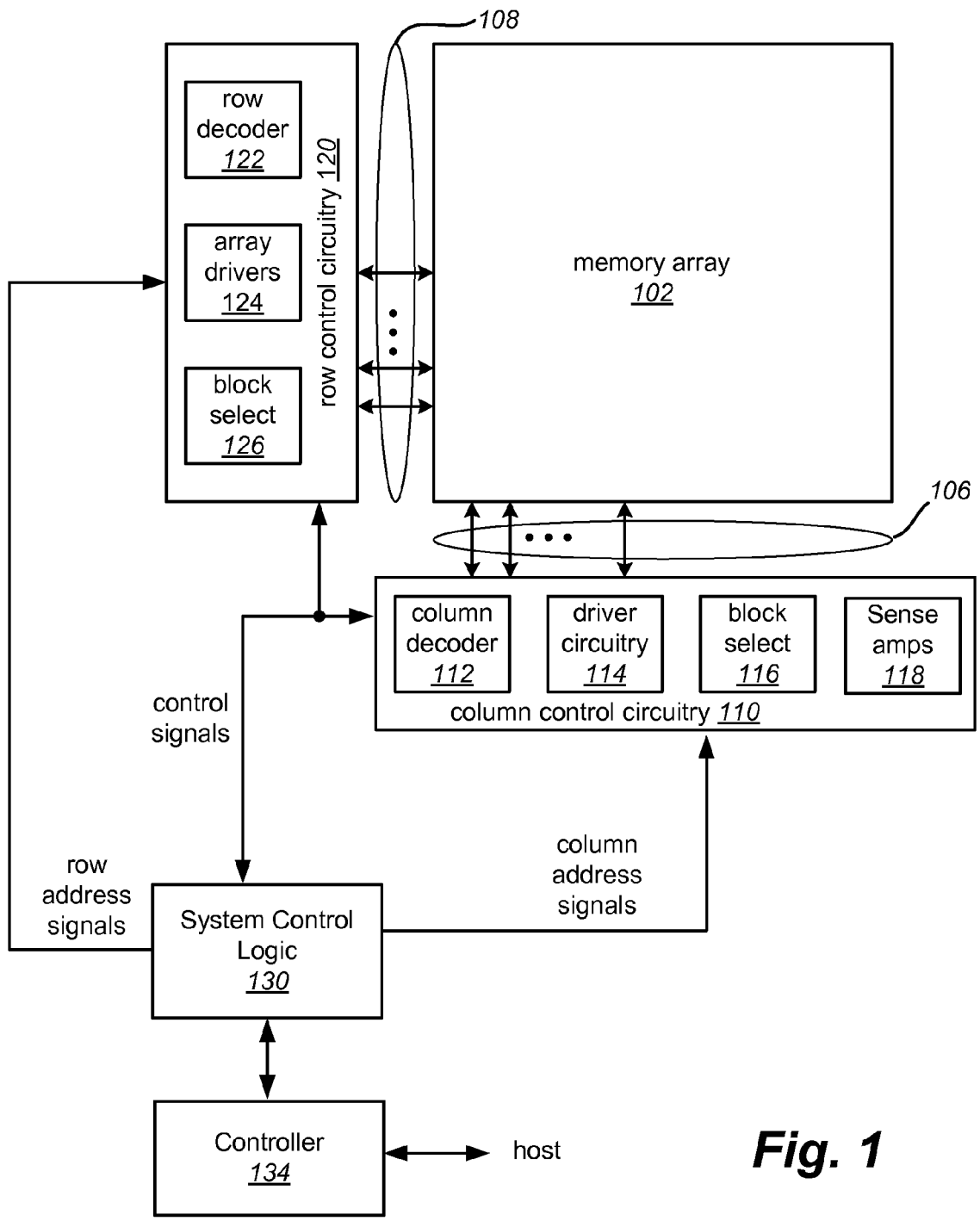
FIG. 1 is a block diagram of one embodiment of a memory system.

FIG. 1 is a block diagram that depicts one example of a memory system 100 that can implement the technology described herein. Memory system 100 includes a memory array 102, which can be a two or three-dimensional array of memory cells. In one embodiment, memory array 102 is a monolithic three-dimensional memory array. The array terminal lines of memory array 102 include the various layer(s) of word lines organized as rows, and the various layer(s) of bit lines organized as columns. However, other orientations can also be implemented.

Memory system 100 includes row control circuitry 120, whose outputs 108 are connected to respective word lines of the memory array 102. For purposes of this document, a connection can be a direct connection or indirect connection (e.g., via one or more other parts). Row control circuitry 120 receives a group of M row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of N column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used herein.

System control logic 130 receives data and commands from controller 134 and provides output data to controller 134. Controller 134 communicates with host. System control logic 130 may include one or more state machines, registers and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above system control logic 130, column control circuitry 110 and row control circuitry 120). In some cases, a portion of the control circuitry can be formed on the same layers as some of the memory array. More information about suitable embodiments like that of FIG. 1 can be found in the following United States patents that are incorporated herein by reference in their entirety: U.S. Pat. No. 6,879,505; U.S. Pat. No. 7,286,439; U.S. Pat. No. 6,856,572; and U.S. Pat. No. 7,359,279. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be thought of as one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. No. 6,034,882; U.S. Pat. No. 6,525,953; U.S. Pat. No. 6,952,043; U.S. Pat. No. 6,420,215; U.S. Pat. No. 6,951,780; and U.S. Pat. No. 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistance-switching material having a resistivity that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
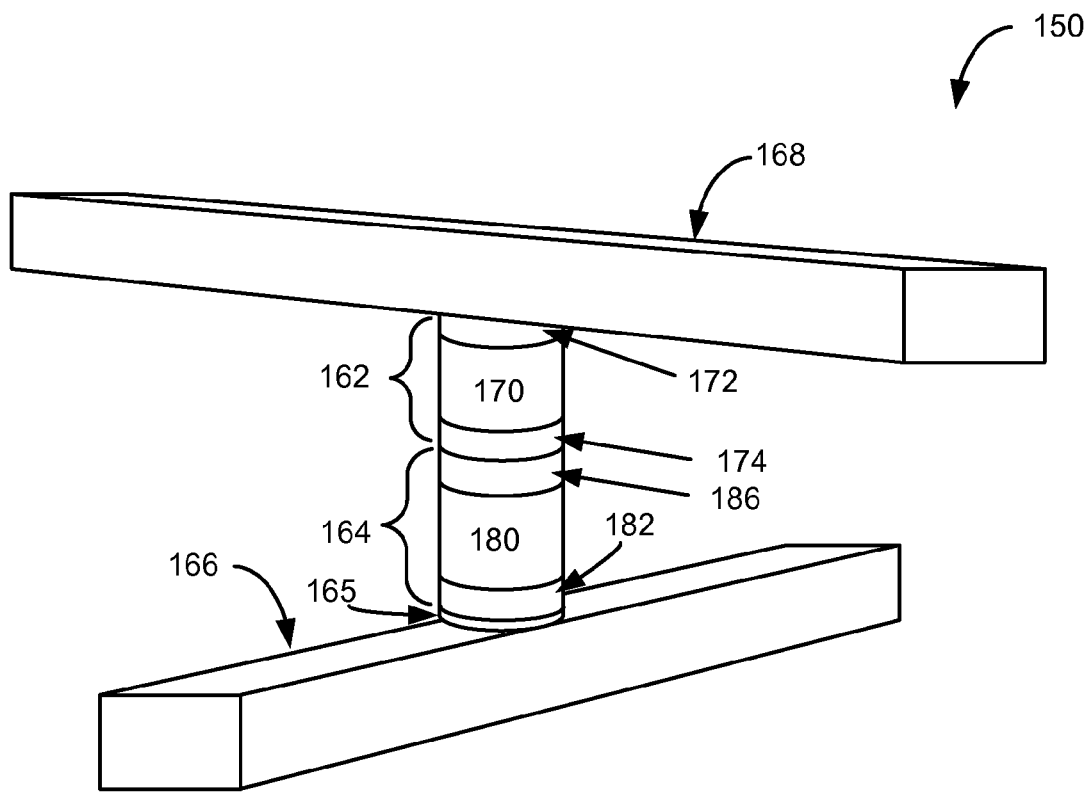
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168.

Reversible resistance-switching element 263 includes reversible resistance-switching material 170 having a resistance that may be reversibly switched between two or more states. In some embodiments, reversible resistance-switching material 170 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 170 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO-, $NiO_x$- or $NiO_xP_y$-containing layer may be selectively deposited above the steering element using a selective deposition process and then annealed and/or oxidized (if necessary).

Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_1$—

$XCa_XMnO_3$ (PCMO), $La_1—XCa_XMnO_3$ (LCMO), LaSrMnO$_3$ (LSMO), or $GdBaCo_XO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_XB_Y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is formed in a memory cell adjacent to a reservoir of mobile metal ions. Some other solid electrolyte material could substitute for chalcogenide glass.

Other variable resistance material includes amorphous carbon, graphite and carbon nanotubes. Other materials can also be used with the technology described herein.

More information about fabricating a memory cell using reversible resistance-switching material can be found in United States Patent Application Publication 2009/0001343, "Memory Cell That Employs A Selectively Deposited Reversible Resistance Switching Element and Methods of Forming The Same," incorporated herein by reference in its entirety. Additional information can also be found in U.S. patent application Ser. No. 12/339,313, "Reverse Set With Current Limit for Non-Volatile Storage," filed on Dec. 19, 2008, incorporated herein by reference in its entirety.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistance silicon thereby is provided. Similar results may be achieved for silicon-germanium alloy and/or germanium diodes.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication.

Although the reversible resistance-switching element 162 is shown as being positioned above the steering element 164 in FIG. 2, it will be understood that in alternative embodiments, the reversible resistance-switching element 162 may be positioned below the steering element 164.

While FIG. 2 shows one example of a memory cell, no one particular type or structure of a memory cell is required for the technology disclosed herein. Many different types of memory cells can be used.

Figure 3:
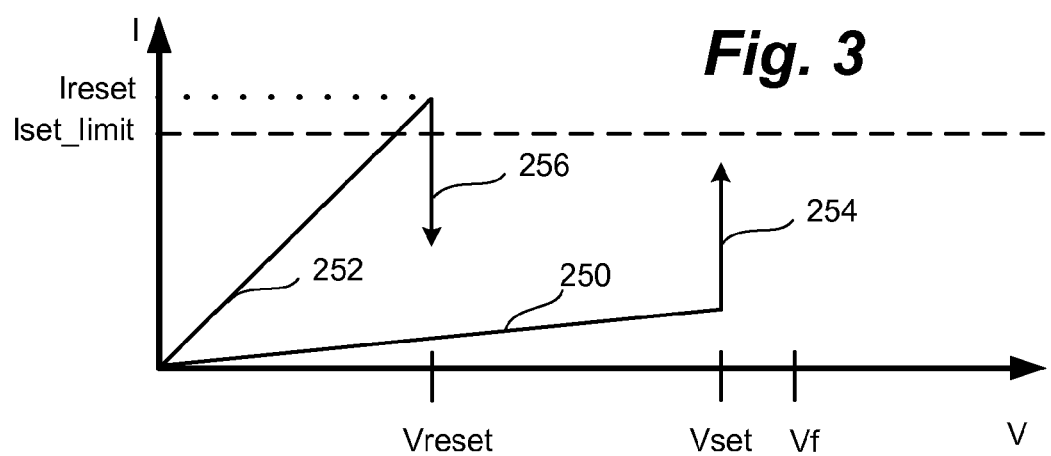
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein. Examples of SET and RESET can be found in U.S. patent application Ser. No. 12/339,313, "Reverse Set With Current Limit for Non-Volatile Storage," filed on Dec. 19, 2008, incorporated herein by reference in its entirety; United States Patent Application 2007/0072360, incorporated herein by reference in its entirety; and United States Patent Application 2007/0008785, incorporated herein by reference in its entirety.

In some embodiments, circuits that provide, control and/or limit the current through a memory cell can be far away from the memory cell. This distance can be more of an issue for a monolithic three dimensional memory array where the control circuitry is on the substrate surface and the memory cells are on upper layers of the three dimensional memory array (as described above). Because of this distance, the conductive paths can get quite long which results in relatively large capacitances for the lines. In some cases, after a memory cell is SET, the capacitive charge on the lines will subsequently dissipate through the memory cell, which can cause extra current to pass through the reversible resistance-switching element. This extra current may cause the reversible resistance-switching element to SET to such a low resistance value that it is difficult or impossible to RESET the element. One proposed solution is to discharge the bit line and data bus during the SET operation so that after the SET have been achieved, no unwanted current will subsequently be driven through the memory cell. In this embodiment, the diode will be forward biased during the SET operation and Vset will be applied to the memory cell as a pulse. The Vset pulse will be shorter then the time needed to SET the reversible resistance-switching element so that the charge from the bit line and data bus will be needed to provide the extra charge not provided by the Vset pulse.

For example, a voltage pulse will be used to charge the bit line connected to a memory cell. Due to its parasitic capacitance, the bit line will hold a charge. After being charged up, the bit line will be cut off from the voltage source so that the bit line is floating. The charge on the bit line will then discharge through the memory cell to the word lines, causing the memory cell to SET. This process will be referred to as the capacitance discharge method of programming.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
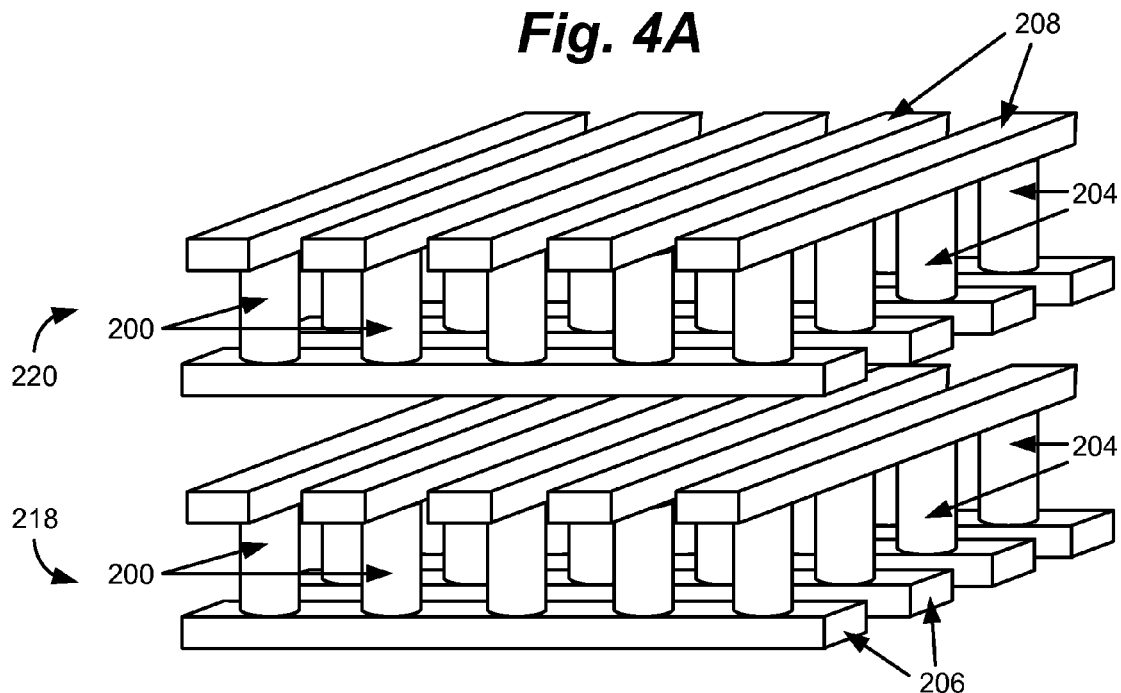
FIG. 4A is a simplified perspective view of a portion of one embodiment of a three-dimensional memory array.

Memory array 102 will comprise many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
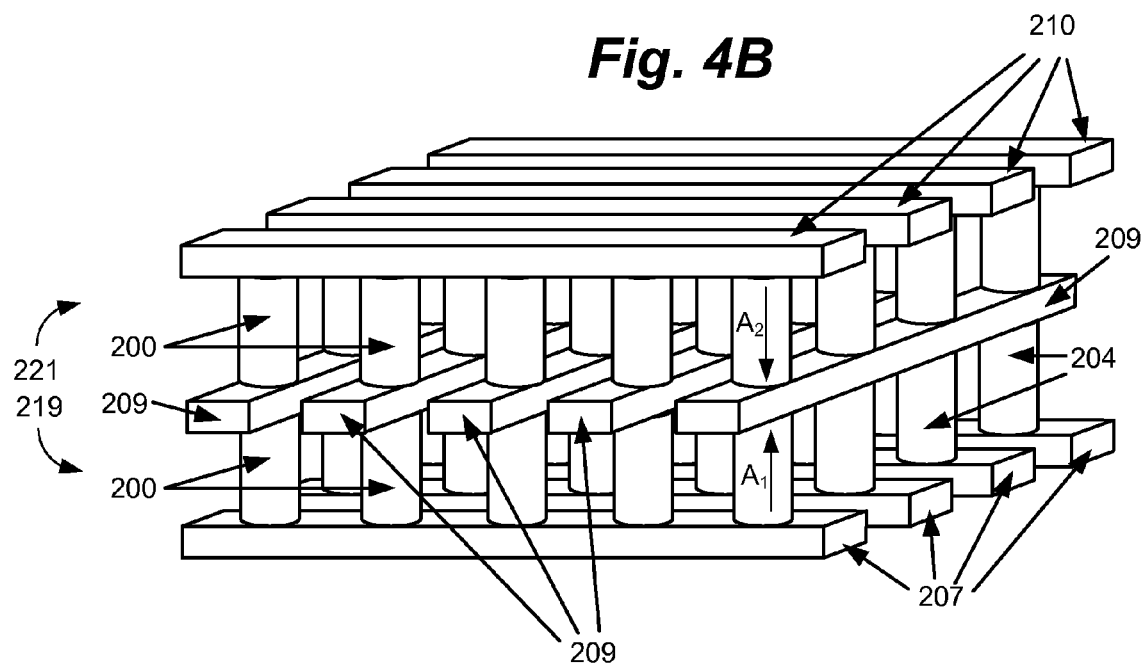
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B. Additional information is described in U.S. Pat. No. 6,952,030, "High-Density Three-Dimensional Memory Cell," which is hereby incorporated by reference herein in its entirety.

In the embodiment of FIG. 4B, the diodes (or other steering devices) on adjacent memory levels preferably point in opposite directions, as described in U.S. Patent Application Publication No. 20070190722, filed Mar. 27, 2007 and titled "Method to Form Upward Pointing P-I-N Diodes Having Large And Uniform Current," which is hereby incorporated by reference herein in its entirety. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 5:
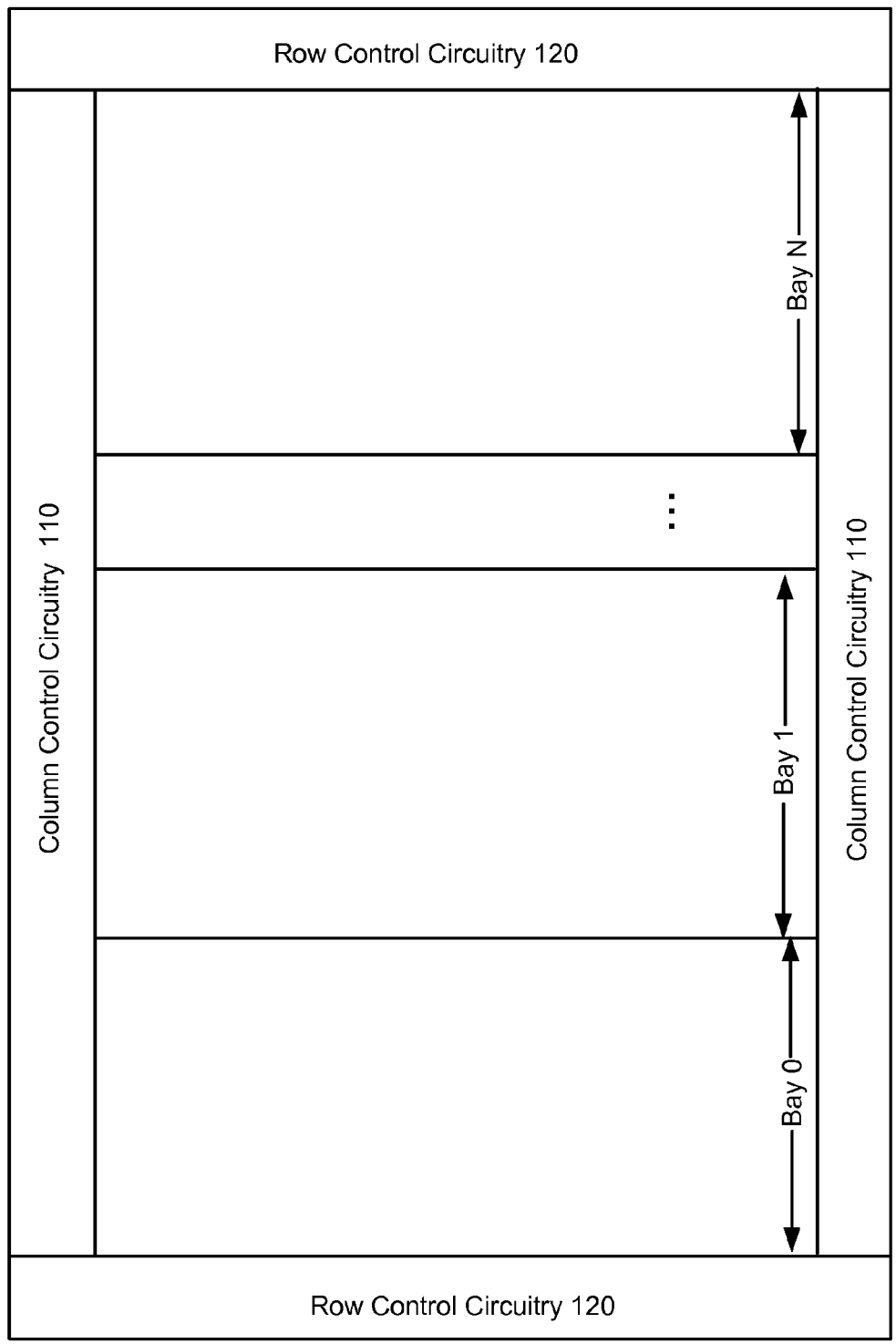
FIG. 5 depicts a logical view of one embodiment of a memory array.
Figure 6:
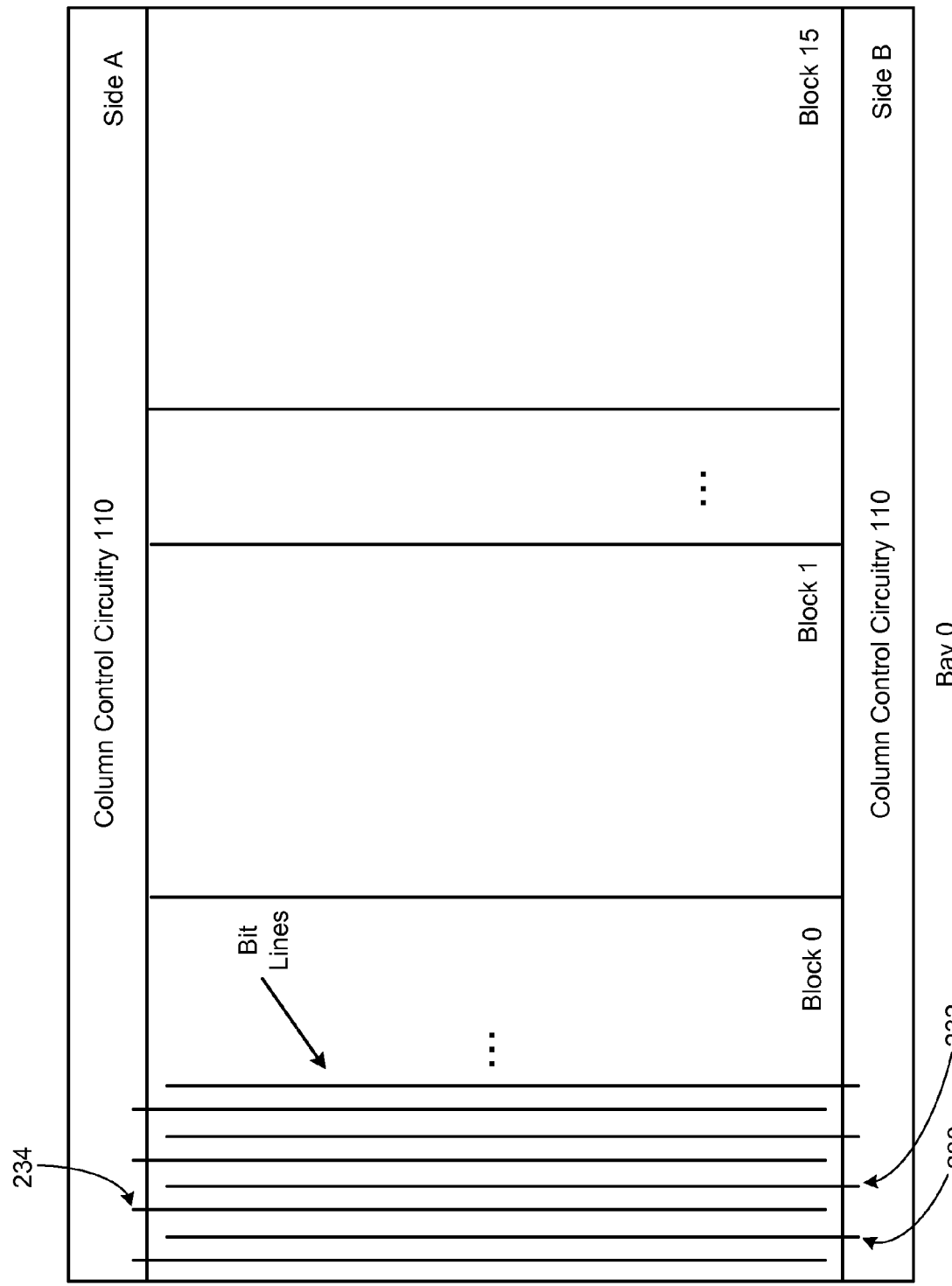
FIG. 6 depicts a logical view of one embodiment of a bay in a memory array.

Memory array 102 is subdivided into bays, and each bay can (optionally) be divided into a number of blocks. FIG. 5 shows a logical view of memory array 102 divided into bays (e.g., Bay 0, Bay 1, . . . Bay N). The number of bays can be different for different implementations. Some embodiments may use only one bay. FIG. 6 shows one bay (e.g., Bay 0) divided into blocks (Block 0-Block 15). In one embodiment, there are 16 blocks in a bay. However, other embodiments can use different numbers of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

Figure 6A:
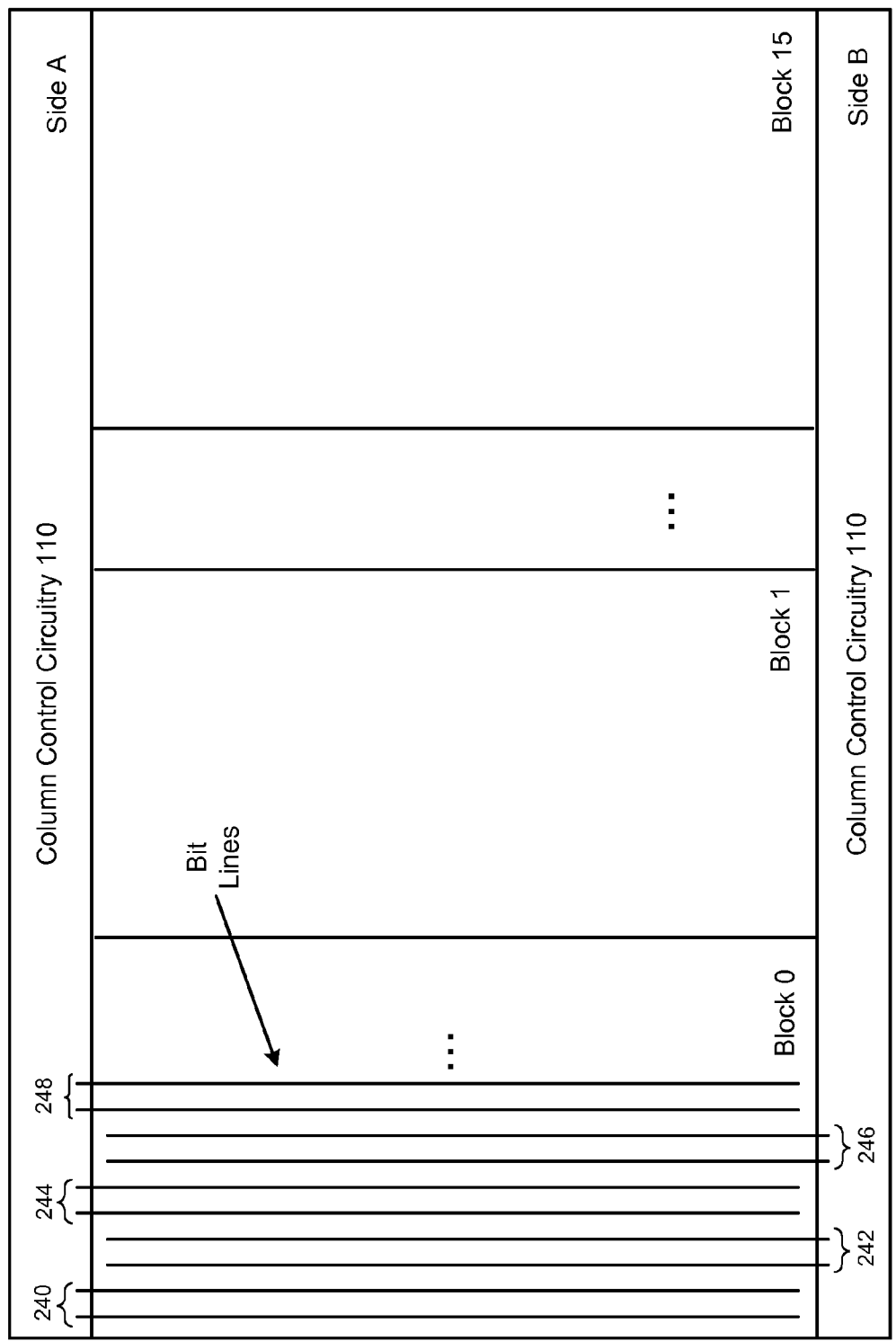
FIG. 6A depicts a logical view of another embodiment of a bay in a memory array.

FIG. 6 shows a subset of the Bit Lines for Block 0. In some embodiments that implement a monolithic three dimensional memory array, the substrate is wider than the memory array; therefore, portions of the Column Control Circuitry 110 can protrude out from under the memory array to facilitate connections using vias and zias (multi-level vias) to R1, R2, Top Metal, and the bit lines. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half (or another fraction) of the bit lines for a block are connected to one set of circuits of Column Control Circuitry 110 on side A and the other half (or another fraction) of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. In one example, even bit lines are connected to Column Control Circuitry 110 on side A and the odd bit lines are connected to Column Control Circuitry 110 on side B; however, other arrangements can also be used. FIG. 6A shows another embodiment of a block where the bit lines are grouped so that every other group of bit lines connects to Column Control Circuitry 110 on side A and the intervening groups of bit lines connects to Column Control Circuitry 110 on side B. For example, FIG. 6A shows groups of bit lines 240, 242, 244, 246 and 248. Groups 240, 244 and 248 connected to Column Control Circuitry 110 on side A. Groups 242 and 246 connect to Column Control Circuitry 110 on side B. As can be seen, group 242 is arranged between groups 240 and 244, and group 246 is arranged between groups 244 and 248. In one embodiment, each group of bit lines includes two bit lines. In other embodiments, each group of bit lines includes more than two bit lines (e.g., four bit lines or more). In some implementations each group of bit lines has the same number of bit lines, while in other implementations the groups of bit lines can have varying numbers of bit lines.

In one embodiment, there are two sense amplifiers located below each block, for example, on the surface of the substrate. One of the two sense amplifiers are for bit lines that connect to Column Control Circuitry 110 on side A and the other sense amplifier is for bit lines that connect to Column Control Circuitry 110 on side B. In the embodiment that includes 16 blocks in a bay, there are 32 sense amplifiers for a bay with sixteen for each side (side A and side B). In one embodiment, one property of a bay is that all of the blocks in the bay share the same 32 sense amplifiers. That means that 32 memory cells in a bay can be simultaneously selected for programming or reading. Thus, the memory system includes circuits for selecting the 32 memory cells and lines for routing signals between the 32 selected memory cells and the sense amplifiers.

Figure 7:
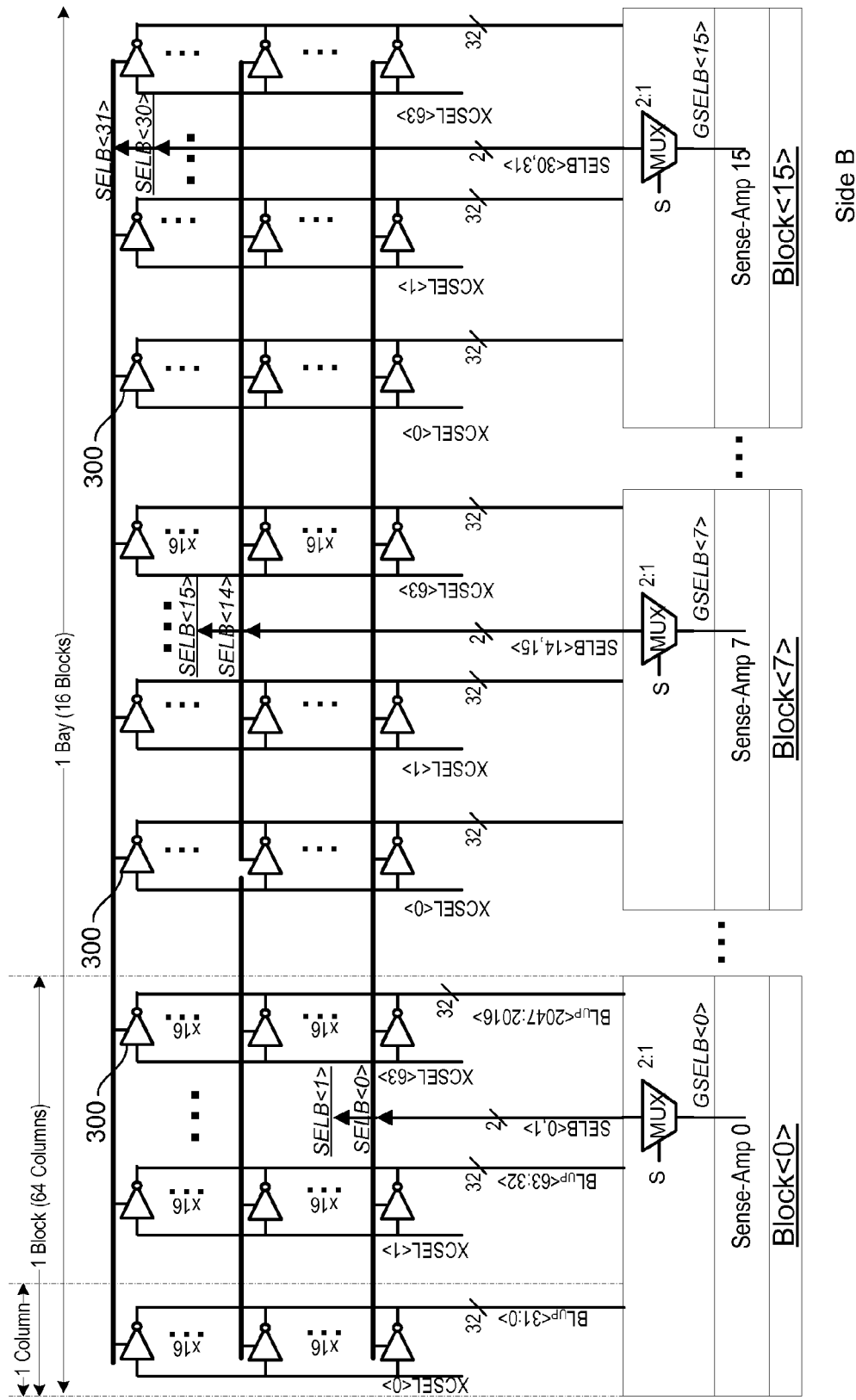
FIG. 7 is a schematic diagram of one embodiment of the data lines and selection circuits for connecting bit lines to the column control circuitry via the data lines.

FIG. 7 is a schematic diagram that depicts a portion of the routing signals and selection circuits for one example architecture for a bay in memory array 102. In this embodiment, there are 16 blocks in the bay. Depicted are portions of three blocks: Block 0, Block 7 and block 15. Each block has 64 columns of selection circuits 300 for electrically connecting 32 bit lines for the column to sense amplifiers on one side of the array (e.g. side A) and 64 columns of selection circuits for connecting to 32 bit lines to sense amplifiers on the other side of the array (e.g. side B). FIG. 7 only shows the 64 columns of selection circuits 300 for connecting to side B. Each block, therefore, has 64 columns×32 bit lines×2 (top and bottom) =4096 bit lines for every block. In one embodiment, the three dimensional memory array includes four layers, with 1024 bit lines per layers. Other arrangements of the decoding circuits, bit lines and layers can also be used. Other amounts of bit lines, columns and selection circuitry can also be used.

The bay of FIG. 7 includes local data lines SELB<31:0>. Selection circuits 300 for a particular column are used to selectively connect the 32 bit lines for that same column to the 32 respective local data lines SELB<31:0>. For example, the first column of block 0 includes bit lines BL<31:0>, the second column of block 0 includes bit lines BL<63:32>, the third column of block 0 includes bit lines BL<95:64>, . . . , the sixty fourth column of block 0 includes bit lines BL<2047: 2016>.

Each of the selection circuits 300 receives one of the selection signals XCSEL <63:0> from column decoders 112 and a bit line connection from one of the 32 bit lines associated with the column. Based on the respective selection signal of XCSEL <63:0> received from column decoder 112, the selection circuit 300 will connect, or not connect, the respective bit line to a respective one of the local data lines SELB<31:0>. For example, the first column of a block receives XCSEL <0>, the second column of a block receives XCSEL <1>, . . . , and the sixty fourth column of a block receives XCSEL <63>. When XCSEL<0> is "0", the first column is selected and bit lines BL<31:0> are connected to local data lines SELB<31:0>, respectively. When XCSEL<1> is "0", the second column is selected and bit lines BL<63:32> are connected to local data lines SELB<31:0>, respectively. When XCSEL<63> is "0", the sixty fourth column is selected and bit lines BL<2047:2016> are connected to local data lines SELB<31:0>, respectively. Note that, in one embodiment, no more than one bit of XCSEL <63:0> is "0" at any given time. In one embodiment, each block will have its own set of XCSEL <63:0>, so that blocks are individually selected. In another embodiment, the selection circuits will receive one or more block selection signals from column decoders 112 (or other control circuitry) to select a particular block.

Each block has its two 2:1 multiplexers that are associated with the block and located on the substrate below the block. One of the multiplexers is for side A and the other is for side B. FIG. 7 shows multiplexers MUX for side B only. Each of 32 local data lines SELB<31:0> is connected to a respective 2:1 multiplexer (MUX). For example, the multiplexer for block 0 receives SELB0<0> and SELB0<1>, the multiplexer for block 7 receives SELB0<14> and SELB0<15>, . . . , and the multiplexer for block 15 receives SELB0<30> and SELB0<31>. Each of the multiplexers in a bay receive a common multiplexer selection signal (e.g., signal S) from column decoders 112 so that 16 of the 32 local data lines are selected. In one embodiment, multiplexer selection signal S causes either the sixteen even local data lines (e.g., SELB0<0>, SELB0<2>, SELB0<4>, etc.) to be selected or the sixteen odd local data lines (e.g., SELB0<1>, SELB0<3>, SELB0<5>, etc.) to be selected.

The output of a multiplexer MUX is connected to a respective global data lines. For example, the output of the multiplexer for block 0 is connected to global data lines GSELB<0>, the output of the multiplexer for block 7 is connected to global data lines GSELB<7>, and the output of the multiplexer for block 15 is connected to global data lines GSELB<15>. Each of the global data lines are connected to a respective sense amplifier that can read signals from the global data line or drive signals on the data line. For example, GSELB<0> is connected to Sense Amp 0, GSELB<7> is connected to Sense Amp 7, and GSELB<15> is connected to Sense Amp 15. The sixteen local data lines selected by the multiplexers are connected to the global data lines GSELB [15:0] so that a memory operation (e.g. Read, SET, RESET) is performed on the selected memory cells. The output of a particular sense amplifier is connected to a global data line, then to a local data line by way of a multiplexer, and then to a bit line by way of a selection circuit 300. The bit lines are connected to the memory cells.

As mentioned above, FIG. 7 only shows the connection paths to sense amplifiers on one side (e.g., side B) of the blocks. Thus, there is another set of local data lines, another set of global data lines and another set of sense amplifiers for side A of each bay in addition to that which is depicted for FIG. 7. Therefore, there can be 64 selected bit lines that are connected to 64 local data lines, for which 32 multiplexers choose 32 local data lines to connect to 32 global data lines. The 32 global data lines are connected to 32 sense amplifiers associated with that particular bay.

The choice of 16 blocks in a bay, 64 bit lines in a column, using 64 local data lines, and 32 global data lines is for one set of embodiments. In other embodiments, different numbers of each item can be used.

In FIG. 7, the bit lines are numbered BL<31:0>, BL<63: 32>, . . . BL<2047:2016>, . . . . This numbering is for purposes of reference with respect to FIG. 7, and does not necessarily (although it could) represent the position of the bit line in the block. In the example of FIG. 6, the bit lines alternate between side A and side B; therefore, BL<0> and BL<1> of FIG. 7 are the first two odd bit lines 230 and 232 to connect to Column Control Circuitry 110 on side B and there is an interleaving even bit line 234 between BL<0> and BL<1> that connects to Column Control Circuitry 110 on side A. In the example of FIG. 6A, BL<0> and BL<1> of FIG. 7 are the bit lines from group 242, and BL<2> and BL<3> of FIG. 7 are the bit lines from group 246.

Figure 8:
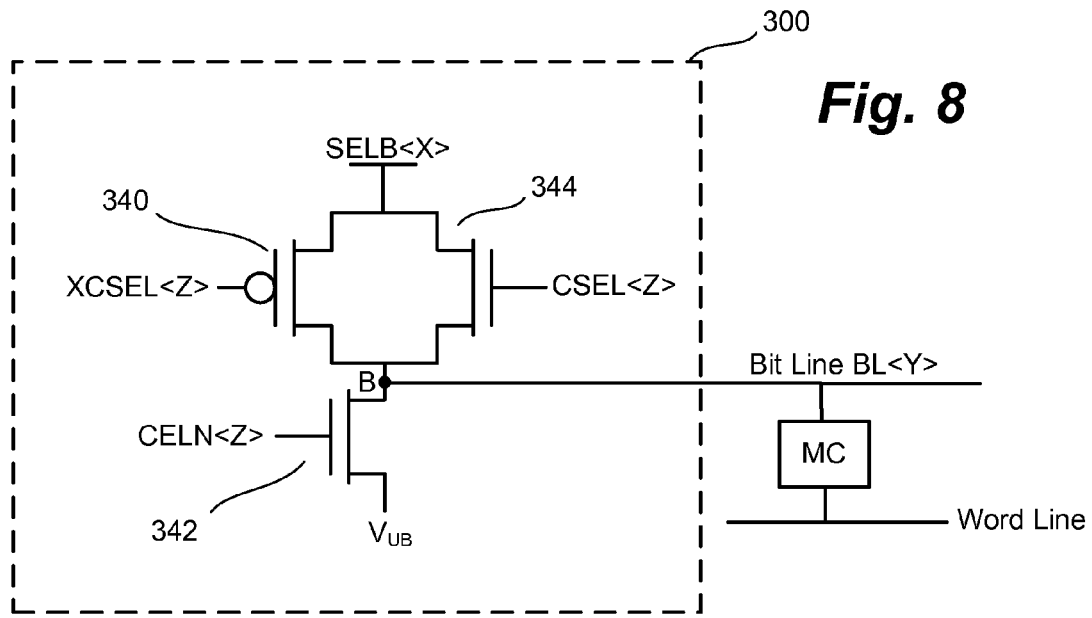
FIG. 8 is a schematic diagram of one embodiment of a selection circuit.

FIG. 8 is a schematic diagram showing the details of one embodiment of selection circuits 300. The selection circuit 300 is connected to one of the local data lines (labeled in FIG. 8 as SELB<X>) and one of the bit lines (labeled in FIG. 8 as BL<Y>). The bit line is connected to one terminal of the memory cell. A word line is connected to the other terminal of the memory cell. Selection circuit 300 includes transistor 340 and transistor 344 both connected to SELB<X>. Transistor 340 and transistor 344 are also both connected to transistor 342 at node B. Bit line BL<X> is also connected to node B. Transistor 342 is also connected to VUB (e.g. 0.5 v), the unselected bit line voltage. The gate of transistor 340 is connected to selection signal XCSEL<Z>. The base of transistor 344 is connected to selection signal CSEL<Z>. Note that XCSEL<Z> is an inverted version of CSEL<Z>. The base of transistor 342 is connected to CELN<Z>. The signals CSEL<Z>, XCSEL<Z>, and CELN<Z> are provided by column decoder 112. In other embodiments, those signals can be provided by other circuits, such as system control logic 130, driver circuitry 114, sense amps 118 or other portions of column control circuits. The signal CELN<Z> is independently controlled so that transistor 342 can be independently controlled from transistors 340 and 342. Each column will have its own independent CELN<Z> so that all bit lines in that column have the same CELN<Z>.

When the respective column is selected, XCSEL<Z> is 0 and CSEL<Z> is 1; therefore, transistors 340 and 344 are on. This condition connects the bit line BL<Y> with the local data line SELB<X>.

When the respective column is not selected, then XCSEL<Z> is 0 and CSEL<Z> is 1; therefore, transistors 340 and 344 are off. This condition disconnects the bit line BL<Y> from the local data line SELB<X>. When transistors 340 and 344 are off and CELN<Z> is 1, then transistor 342 is on and the bit line BL<Y> is receiving the unselected bit line voltage VUB. When transistors 340 and 344 are off and CELN<Z> is 0, then transistor 342 is off and the bit line BL<Y> is floating. This condition is useful for the some embodiments of the capacitance discharge method of programming described herein.

If the 2:1 multiplexers (MUX) of a block are traditional multiplexers and share a common selection signal S, then in one embodiment the memory operation being performed is first performed for a first set of sixteen select lines. After the memory operation completes for the first set of sixteen select lines, then the common selection signal S can be changed (immediately or later on after other programming operations) and the memory operation (same or different memory operation) is performed for the second set of sixteen select lines. For example, when performing a memory operation (e.g. Read, SET, RESET), the common multiplexer selection signal S is set so that the multiplexers first choose SELB0[0], SELB0[2], . . . SELB0[30]. Therefore, the memory operation is performed (during a first pass) on those memory cells connected to bit lines that have been connected (via selection circuits 500) to local data lines SELB0[0], SELB0[2], . . . SELB0[30]. After all 16 memory cells have completed the memory operation, common selection signal S can be toggled so that the multiplexers then choose SELB0[1], SELB0[3], . . . SELB0[31] and the memory operation is performed (during a second pass) on those memory cells connected to bit lines that have been connected to local data lines SELB0[1], SELB0[3], . . . SELB0[31]. If one of the sixteen memory cells of the first pass is slow to complete the memory operation, then the start of the second pass is delayed for all sixteen memory cells. In some embodiments, multiple bays (e.g. x bays) are operated on in parallel and share a common selection signal, so that if any one of the 16(x) memory cells is slow to complete the memory operation, then the start of the second pass is delayed for all 16(x) memory cells. As the number of memory cells operated on in parallel increases, the potential for delay also increases. The capacitive discharge method of programming described herein can help alleviate this delay.

Figure 9:
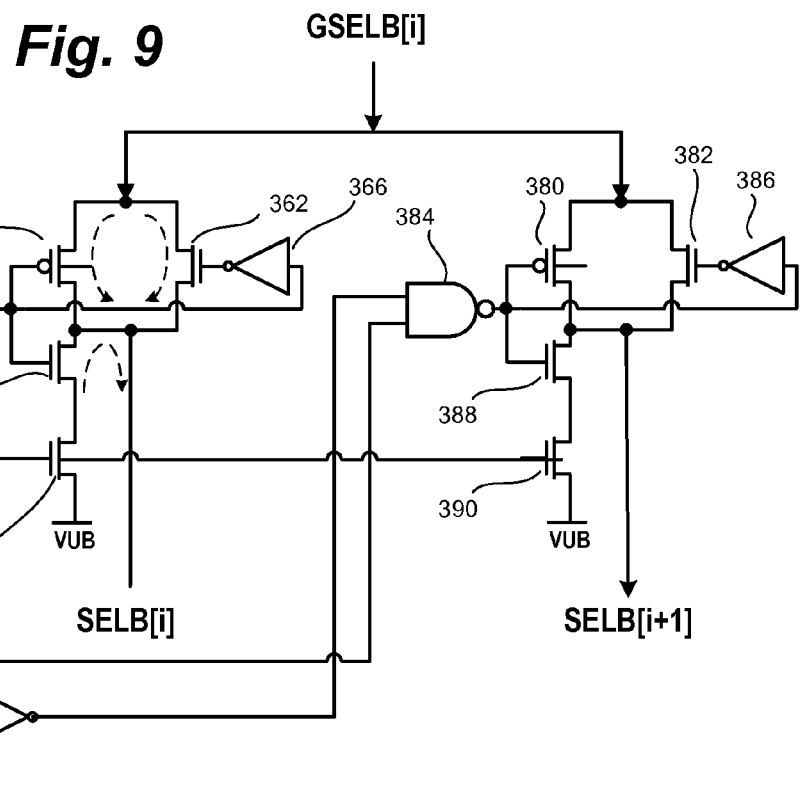
FIG. 9 is a schematic diagram of one embodiment of a multiplexer circuit.

FIG. 9 is a schematic of a circuit for the 2:1 multiplexers (MUX) depicted in FIG. 7. The respective global data line GSELB<i> is connected to transistors 360, 362, 380 and 382. Transistors 360 and 362 are also connected to the first of the two local data lines SELB<i>. Thus, transistors 360 and 362 provide a path between the global data line GSELB<i> and the local data line SELB<i> when the transistor are on. In addition to being connected to GSELB<i>, transistors 380 and 382 are also connected to the second local data line SELB<i+1>. Thus, transistors 380 and 382 provide a path between global data line GSELB<i> and the second local data line SELB<i+1> when the transistors are on.

The inverted gate of transistor 360 is connected to the output of NAND gate 364. The gate of transistor 362 is connected to the output of inverter 366. The input of inverter 366 is connected to the output of NAND gate 364. The output of NAND gate 364 is also connected to the gate of transistor 368. Transistor 368 is connected between SELB<i> and transistor 370. Transistor 370 is connected between transistor 368 and the voltage VUB. The gate of transistor 370 receives the signal DSG_MODE from system control logic 130. The signal DSG_MODE is set to 0 when performing one of the possible embodiments of the programming operation using the capacitance discharge mode of programming described herein. By setting signal DSG_MODE to 0, transistor 370 will prevent an unselected local data line from being connected to VUB and, instead, cause the unselected local data line to float.

The output of NAND gate 384 is connected to the gate of transistor 380, the input of inverter 386 and the gate of transistor 388. The output of inverter 386 is connected to the gate of transistor 382. Transistor 388 is connected between local data line SELB<i+1> and transistor 390. Transistor 390 is connected between transistor 388 and the voltage VUB. The gate of transistor 370 receives the signal DSG_MODE from system control logic 130.

NAND gate 364 receives two inputs from system control logic 130: multiplexer select S and MUX_EN. NAND gate 384 receives two inputs from system control logic 130: an inverted version of multiplexer selection signal S (via inverter 392) and MUX_EN. The signal MUX_EN is normally set to 1 during a memory operation, but can be set to 0 to disable the multiplexer.

The circuits of FIGS. 7-9 can be used to implement the capacitive discharge method of programming. The circuit of FIG. 8 will be used to connect a column of bit lines to the local data lines SELB<31:0> and the circuit of FIG. 9 is used to connect half of the local data lines SELB<31:0> to the global data lines GSELB<15:0>. Once both connections are made, the sixteen sense amplifiers are in communication with sixteen memory cells via the global data lines, the local data line and the bit lines. During a SET operation, the sense amplifiers will apply a voltage to the global data lines to charge up the global data lines due to the parasitic capacitance of the global data lines. When the multiplexers of FIG. 9 (which are one embodiment of a selection circuit) connect the local data lines to the global data lines, then the local data lines will also be charged up. When the selection circuits of FIG. 8 (which are one embodiment of a selection circuit) connect the local data lines to a set of bit lines, sixteen of the bit lines will also be charged. Once the bit line is charged, the signals XCSEL<Z> and CSEL <Z> are toggled, which cuts off the bit line and leaves the bit line floating so that over time the bit line will discharge through the memory cell causing the memory cell to SET, as described above. Once the signals XCSEL<Z> and CSEL <Z> are toggled, the column address (discussed below) and/or multiplexer selection signal S can change so that the local data lines (as well as the global data lines and sense amplifiers) will then be connected to a new column of bit lines and the process will repeat itself. In this manner, the programming for the next column or next set of bit lines will start after charging the previous column of bit lines but without waiting for the previous column to complete the SET operation. By not without waiting for the previous column to complete the SET operation, the programming operation completes in a faster manner. As discussed above, those bit lines selected for programming are floated after being charged. In some embodiments, it is desired that the neighboring bit lines of those bit lines selected for programming not be floated (e.g., driven to VUB). In the embodiment of FIG. 6, if the selected bit line is connected to Column Control Circuitry 110 on side B, then both neighboring bit lines are connected to Column Control Circuitry 110 on side A. To force the neighbors to not be floating, the system can deactivate the decoder for side A by not having any CSEL<Z> active and by keeping the CELN<Z> for each column of side A set to 1. This embodiment uses the circuit of FIG. 8 as selection circuit 300.

Figure 8A:
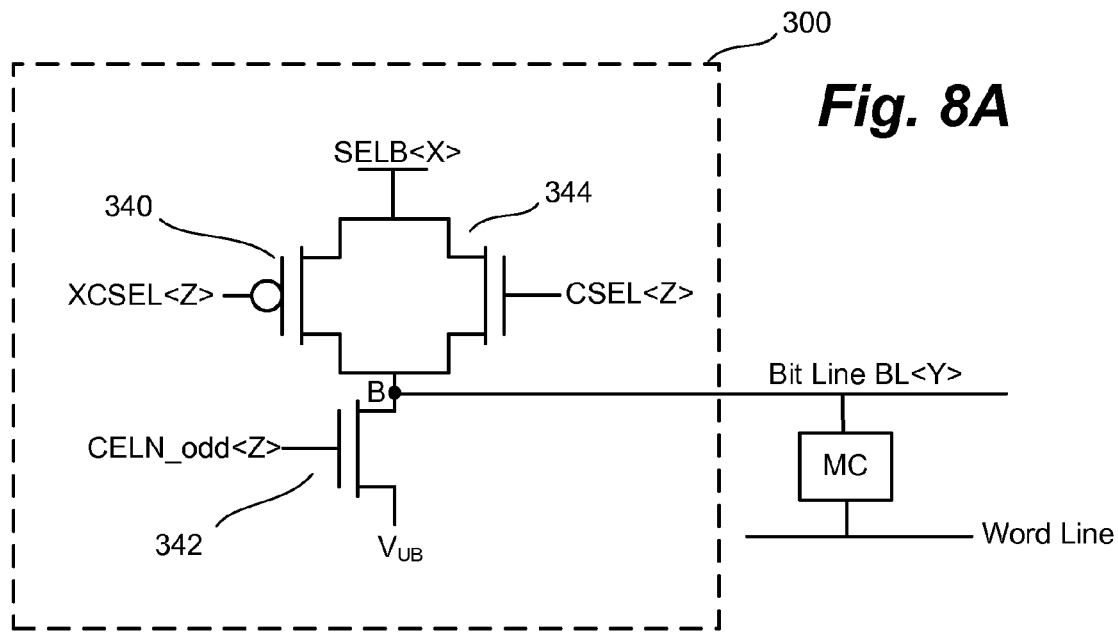
FIG. 8A is a schematic diagram of another embodiment of a selection circuit.
Figure 8B:
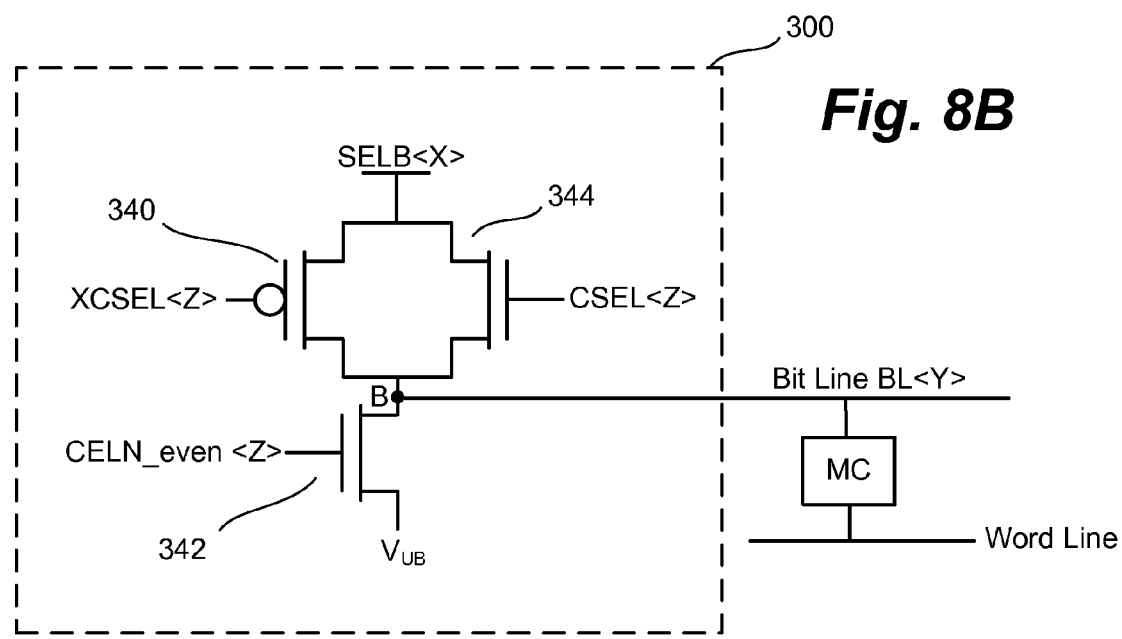
FIG. 8B is a schematic diagram of another embodiment of a selection circuit.

In the embodiment of FIG. 6A (interleaved groups of two bit lines), the selection circuits of FIG. 8A and FIG. 8B will be used instead of the selection circuit of FIG. 8. Odd bit lines for the block will connect to the selection circuit of FIG. 8A and even bit lines for the block will connect to the selection circuit of FIG. 8B. For example, group 242 includes a left bit line and a right bit line. The left bit line would use the circuit of FIG. 8B as selection circuit 300 and the right bit line would use the circuit of 8A as selection circuit 300. The difference between the circuits of FIGS. 8A and 8B is that they have different signals connected to transistor 342. The circuit of FIG. 8A has a signal CELN_odd<Z> connected to transistor 342. The circuit of FIG. 8B has a signal CELN_even<Z> connected to transistor 342. In this manner, when odd bit lines are being programmed, CELN_even<Z> can be set high so that the even bit lines are at VUB and when even bit lines are being programmed, CELN_odd<Z> can be set high so that the odd bit lines are at VUB. Alternatively, or additionally, the signal DSG_MODE of FIG. 9 can be split up so that SELB[i] gets DSG_MODE_i and that SELB[i+1] gets DSG_MODE_i+1 so that the data lines can separately be forced to VUB. Note that there will be separate CELN_odd<Z> and CELN_even<Z> for sides A and B. In some embodiments, the CELN_odd<Z> or CELN_even<Z> are set to 0 for the bit lines being programmed. Additionally, in some embodiments, CELN>Z>, CELN_odd<Z> and/or CELN_even<Z> can be set to 0 for bit lines not being programmed.

The disclosure below describes four sets of embodiments that differ based on the order of changing columns and/or changing multiplexer selection, as well as whether to wait between columns. The technology disclosed herein can cover many variations of the order of switching and when/if to wait for groups of concurrently programmed memory cells to complete the programming.

In the first set of embodiments, the system will prepare the data for all columns, without switching the multiplexers (MUX). That is multiplexer selection signal S is fixed to select odd or even local data lines SELB. The signal DSG_MODE will be fixed at 1 and the signal CELN<Z> is set to 0 for the bit lines to be operated. Data will be loaded for a first column, the column selection will be switched, data will be loaded for the next column, the column selection will be switched, and so on until all columns have been loaded. When data has been loaded for all of the columns, the system will wait for the programming operation to complete for all of the columns. After programming completes for all columns selected, the multiplexer selection signal S can be toggled and the process repeated (if there is additional data to be programmed). In this case, the number of memory cells concurrently programmed by the system is equal to the (number of columns)*(number of sense amplifies). It is possible to further divide the chunks of data that are programmed simultaneously into smaller pieces, such as 8, 16 or 32 columns. It is a trade-off between leakage currents on pre-charged (floating) bit lines, current flowing in the selected word line as many cells are programmed in parallel, and programming speed.

Figure 10:
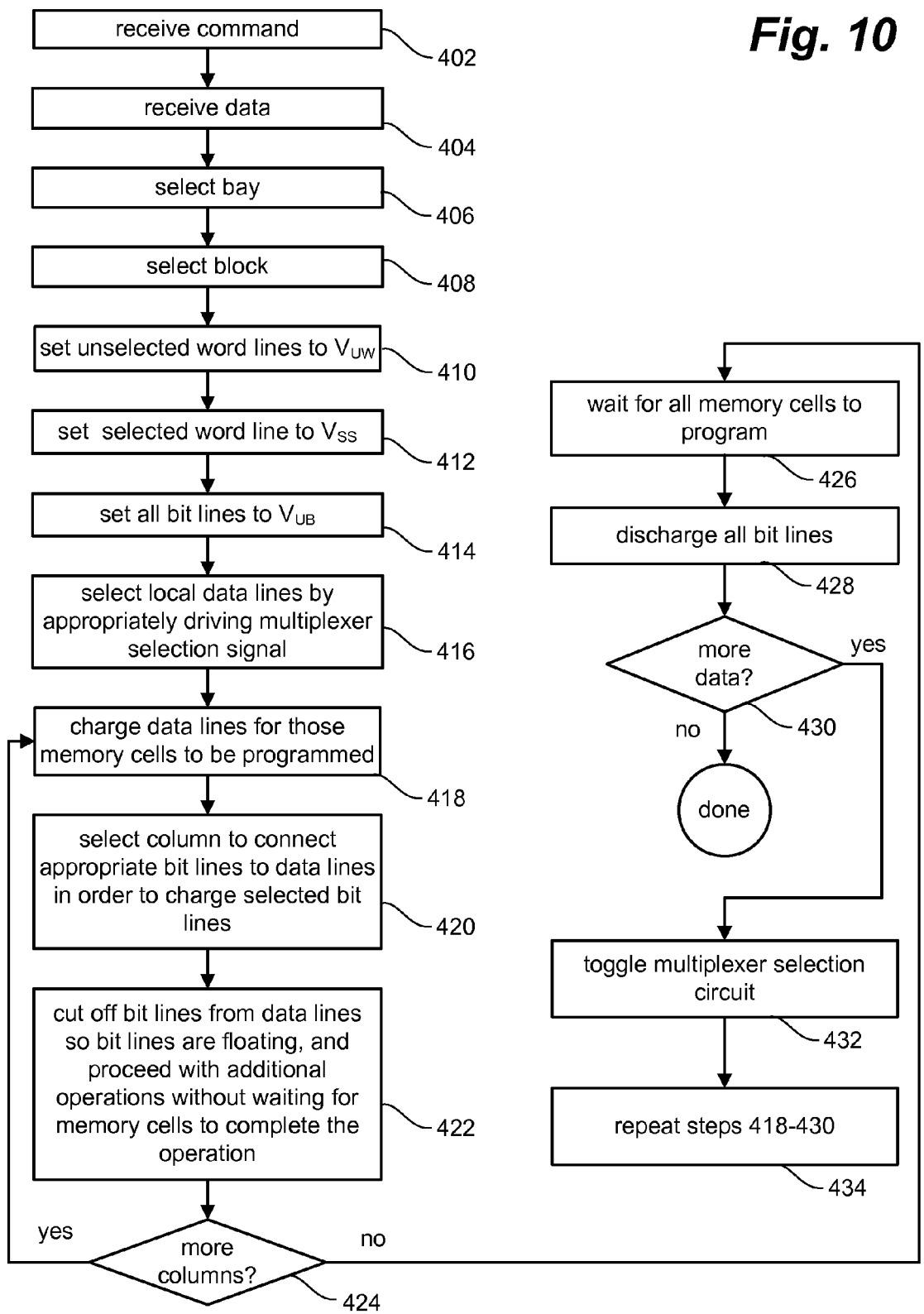
FIG. 10 is a flow chart describing one set of embodiments of a process for operating the data lines and selection circuits.

FIG. 10 is a flow chart describing the operation of the memory system during a programming operation, using the capacitive discharge method of programming, according to the first set of embodiments. In step 402, a command to perform a programming operation is received from the host. In step 404, data for the programming operation is received. In step 406, one bay is selected. In some embodiments, it may be possible to select more than one bay for simultaneous operations. In step 408, a block within the selected bay is selected for a memory operation. Alternatively, one block within each selected bay is selected. In step 410, the appropriate word line is selected and the unselected word lines are set to the unselected word line voltage VUW, which in some embodiments is VWR (e.g., Vset or Vreset)-DV (where DV is a voltage between 0 and the turn-on voltage of the diode selector element, typically 0.6V). In step 412, the selected word line is set to VSS (e.g., 0 volts). In step 414, all bit lines are set to VUB. In step 416, the multiplexers MUX (see FIGS. 7 and 9) are configured to select the appropriate local data lines by driving the correct signal on the multiplexer selection signal S.

In step 418, the sense amplifiers will charge the data lines by applying a voltage to the global data lines. Because the global data lines are connected to the local data lines (step 416), the local data lines will also be charged up. The charging of the data lines is data dependent. That is, the system only charges a data line if the memory cell connected to that data line is to be programmed. If the memory cells is not to be programmed, then the associated data line remains discharged. In step 420, one of the columns of the block is selected. Thus, the bit lines for that column will be connected to the local data lines (via the circuit of FIG. 8, 8A or 8B) so that the charge in the data lines will be shared with the bit lines, and the bit lines will be charged up. In step 422, the bit lines will be cut off from the data lines so that the bit lines are floating. For example, looking at FIG. 8, the appropriate XCSEL<Z> will be 1, CSEL<Z> will be 0, CELN<Z> will be 0. The act of cutting off the bit lines from the data lines will be performed while the bit lines are charged and without waiting for the program operations for the memory cells connected to the bit lines to complete. In some embodiments, the system will not even check to determine whether they completed. Rather, the bit lines will be cut off and the system will proceed with additional programming operations without waiting for the memory cells to complete the programming operation. In step 424, it is determined whether there are more columns of data to program. If there are more columns of data to program, then the process continues at step 418 so that the data lines are again charged and steps 418-424 are repeated. In some implementations, the data lines will still hold some of the charge or all of the charge from the last iteration. Therefore, this iteration of step 418 may only need to provide a partial charge (or no charge in some instances). After step 418, the process will continue in step 420, during which the next column will be selected, and then proceed as discussed above. In this manner, memory cells in multiple columns will be in the programming process concurrently.

If, in step 424, there are no more columns of data to program, then in step 426 the system waits a sufficient amount of time for the memory cells in all of the columns to complete the programming process. In another embodiment, the system can automatically check whether all of the columns have completed programming using a set of detection circuits. In step 428, all unselected bit lines are discharged by pulsing CELN<Z> (or CELN_odd<Z> or CELLN_even<Z>) from 0 to 1 and then back to 0. If there is no more data to program (step 430), then the process is done. If there is more data to program, then the multiplexer selection signal S is toggled and steps 418-430 are repeated so that the memory operation is performed for the other set of local data lines.

Figure 11:
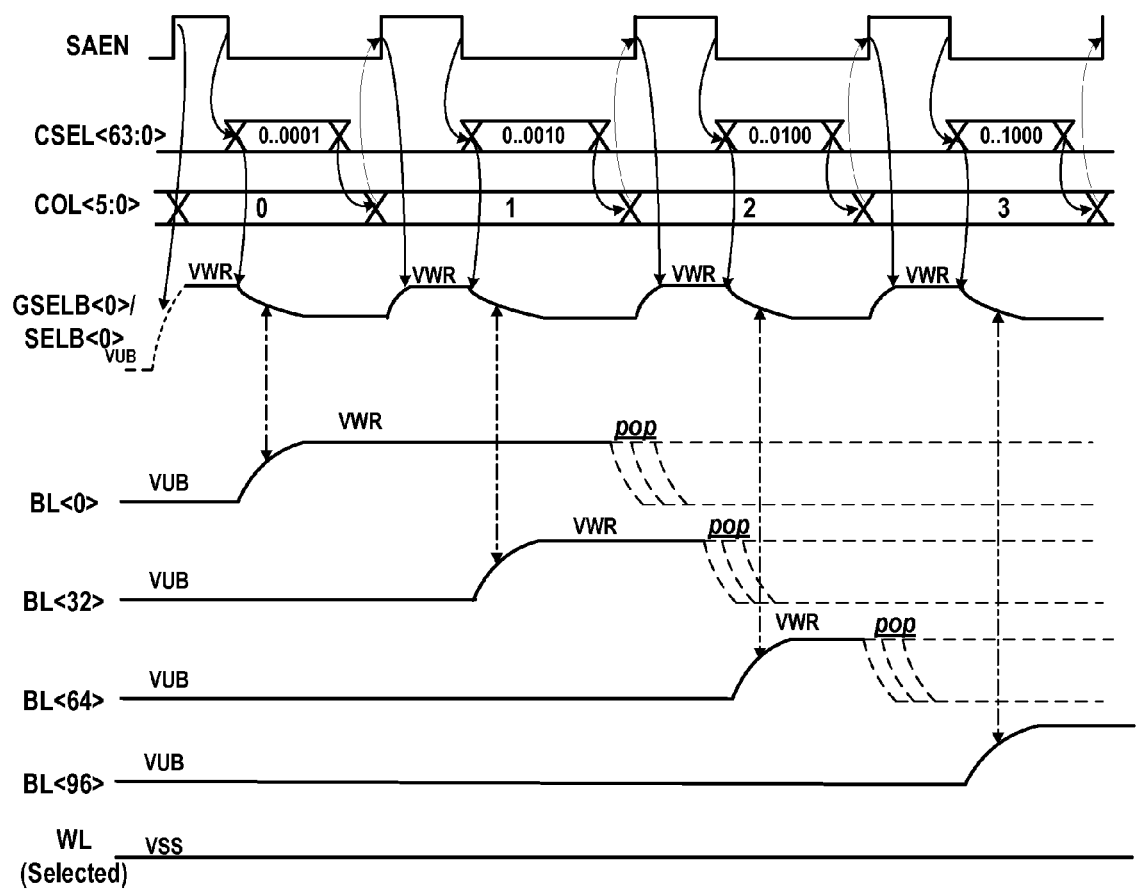
FIG. 11 is a timing diagram providing details of a programming process.

FIG. 11 is a timing diagram that describes multiple iterations of the process of FIG. 10 (e.g. multiple iterations of steps 418-424). FIG. 11 shows nine signals: SAEN, CSEL<63:0>, COL<5:0>, GSELB<0>/SELB<0>, BL<0>, BL<32>, BL<64>, BL<96>, and WL. For this example, it is assumed that the memory cells connected to BL<0>, BL<32>, BL<64>, BL<96> and the selected WL are to be programmed. The signal SAEN is the sense amplifier enable signal. When SAEN is at 1, the sense amplifier will drive a 1 on the respective global data line connected to the sense amplifier. When SAEN is 0, the sense amplifier will drive a 0 on the respective global data line connected to the sense amplifier. The signal CSEL<63:0> includes one bit for each column. When a bit of CSEL<63:0> is at logic 1, the respective column is selected for programming (SET or RESET) or reading. The signal COL<5:0> is the column address. The signal CSEL<63:0> is a decoded version of COL<5:0>. The signals BL<0>, BL<32>, BL<64> and BL<96> are four bit lines in a block. WL represents the selected word line.

The signals depicted in FIG. 11 are associated with sense amplifier 0. As discussed above, sense amplifier 0 is connected to GSELB<0> and (via the MUX) SELB<0>. Local data line SELB<0> can be connected to BL<0>, BL32, BL64, BL96, etc.

In the timing diagram of FIG. 11, the selected word line is at Vss (e.g. 0 volts). The column address COL<5:0> is initially set to indicate column 0. During the first pulse of SAEN depicted in FIG. 11, the global data line GSELB<0> and local data line SELB<0> will be charged up to VWR (e.g., Vset). In response to the conclusion of the pulse of SAEN, CSEL<63:0> will change from all zeros to a single logic 1 for CSEL<0>. This will cause the selection circuit 300 to connect BL<0> to SELB<0> (and GSLEB<0> via SELB<0> and the MUX); therefore, the charge on GSELB<0> and SELB<0> is shared with BL<0>. In this manner, GSELB<0> and SELB<0>, as well as the sense amplifier, serve as a source of charge for BL<0>. As a result, BL<0> will charge up to VWR. After the bit line charges up, CSEL<63:0> will then revert back to all zeros which will trigger a change in the column address COL<5:0> to 1. The changing CSEL<0> from 1 to 0 will cut off BL<0> from GSELB<0> and SELB<0> while BL<0> still holds the charge (including all of the charge or including part of the charge) received from GSELB<0> and SELB<0>. This BL<0> is disconnected after starting the program operation for the memory cell connected to BL<0> and without waiting for completion of that program operation.

The change in column address triggers a new SAEN pulse, which will provide any needed charge to the local and global data lines GSELB<0> and SELB<0>. At the end of the SAEN pulse, CSEL<63:0> will toggle one bit high so that CSEL<1> will be at logic 1. As a result, BL<32> will be in communication with GSELB<0> and SELB<0>, and the charge on GSELB<0> and SELB<0> will be shared with BL<32> so that BL<32> will be charged up to VWR. The charging of BL<32> to VWR starts the program operation for the memory cell connected to BL<32>. As can be seen from FIG. 11, the start of the program operation for the memory cell connected to BL<32> occurs prior to the completion of the program operation for the memory cell connected to BL<32>. Thus, the programming of the memory cell connected to BL<32> is started without waiting for the completion of the programming of the memory cell connected to BL<0> or even checking for the completion of the programming of the memory cell connected to BL<0>. When CSEL<1> is toggled back to 0, column address COL<5:0> will change to column 2, the next SAEN pulse will be provided and the local and global data lines GSELB<0> and SELB<0> will be charged back up to VWR. When CSEL<2> becomes logic 1, BL<64> will be in communication with GSELB<0> and SELB<0> and will charge up to VWR. This process will continue for bit lines BL<96>, BL<128>, BL<160>, etc.

As discussed above, a bit line is charged up when it is put in communication with the local and global data lines in response to the appropriate bit of CSEL<63:0>. When that bit from CSEL<63:0> is toggled back to 0, the bit line is cut off from the local and global data lines and floated, as described above. At some point after cutting off the bit line from the local and global data lines, the memory cell will complete its SET operation by discharging sufficient amounts of the charge on the bit line through the memory cell to the word line. The point when the memory cell changes from the high resistance state to the low resistance state during the SET operation is referred to in FIG. 11 as "POP." How long it takes the memory cell to "POP" may differ for each memory cell, as depicted in FIG. 11. However, the process of FIG. 11 does not require waiting for one memory cell to complete its SET operation before moving on to program the next memory cell. As can be seen, the system charges up a first bit line for a memory cell, cuts off that first bit line, moves on to the next bit line without checking to see if the memory cell connected to the first bit line finished the SET operation, charges up the next bit line, cuts off the next bit line, and moves on to a subsequent bit line, etc. The system does not wait for memory cells connected to previous bit lines to complete the SET operation. In one embodiment, the next programming operation is started without checking the status of the previous operation. The previous bit line is cut off and the system moves on while the previous bit line is still charged. In this manner, the memory cells connected to different bit lines that are in different columns program concurrently, although they may complete the programming at different times. Additionally, the above-described scheme allows for the number of memory cells being programmed concurrently to be greater than the number of sense amplifiers being used in the programming process.

In some embodiments, GSELB<0> and SELB<0> are charged to a value higher than VWR in order to insure that the bit line is charged to VWR.

FIG. 11 only shows the behavior for one local data line SELB<0>. However, the operations illustrated in FIG. 11 are concurrently occurring on up to 15 (or a different number of) other local data lines.

In the embodiment of FIG. 11, each of the bit lines are charged up sequentially. The corresponding memory cells connected to those sequentially charged bit lines are likely to complete the SET operations at different times (as depicted in FIG. 11). The embodiment of FIG. 12 attempts to synchronize the completion of the SET operations. Because different memory cells may take a different amount of time to complete the SET operation, the process of FIG. 12 cannot guarantee that all memory cells will complete the SET operation at the same time. However, the time period for allowing a bit line to discharge through the memory cell will be aligned to start at the same time, as described below.

Figure 12:
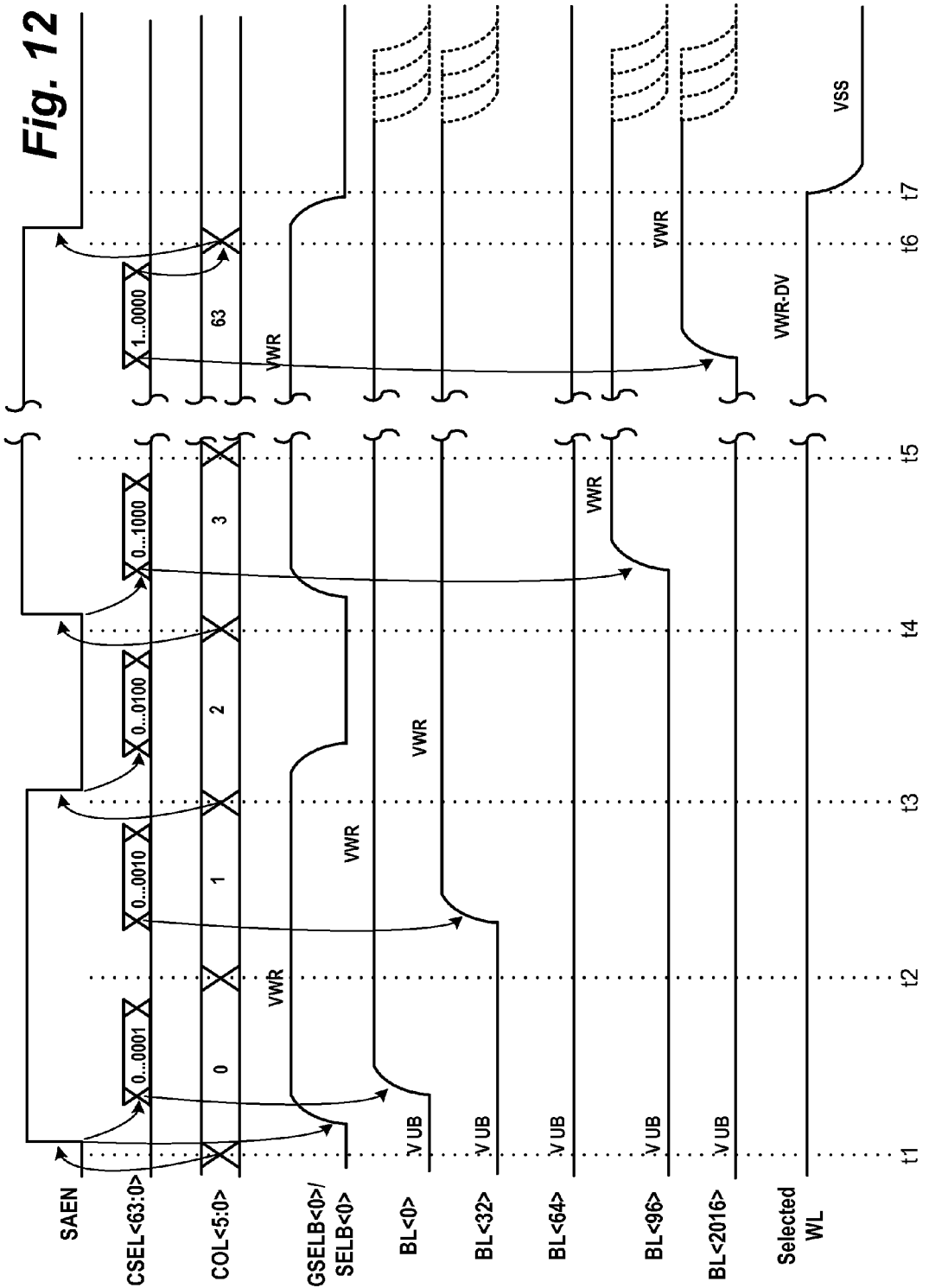
FIG. 12 is a timing diagram providing details of a programming process.

The timing diagram of FIG. 12 shows the same signals as the timing diagram of FIG. 11. Additionally, FIG. 12 shows bit line BL<2016>, which in one embodiment is the last bit line of the block. At time t1, all the bit lines are at VUB, the selected word line is at VWR (e.g., Vset or Vreset)-DV (where DV is a voltage between 0 and the turn-on voltage of the diode selector element, typically 0.6V), the column address becomes column 0, and CSEL<63:0> is at all zeros. The change in the column address causes SAEN to go high, which results in the appropriate bit CSEL<0> becoming 1. The output of SAEN going high causes the sense amplifier to charge up the global and local data lines GSELB<0> and SELB<0> to VWR. The associated CSEL<1> causes bit line BL<0> to be connected SELB<0> so that the local and global data lines GSELB<0> and SELB<0> will share their charge with BL<0>. CSEL<0> will be toggled back to 0, which will cut off bit line BL<0> from the local and global data lines GSELB<0> and SELB<0>. However, because the selected word line is at VWR-DV, the bit line will not dissipate its charge through the memory cell.

At time t2, the column address will change to column 1, and shortly thereafter CSEL<1> will be toggled to logic 1. In this example, SAEN stays high so the local and global data lines will remain at VWR. When CSEL<1> is toggled to 1, BL<32> is put in communication with the local and global data lines GSELB<0> and SELB<0> so that the charge on GSELB<0> and SELB<0> is shared with BL<32> and BL<32> is charged to VWR.

In the example of FIG. 11, it was assumed that the memory cells connected to BL<0>, BL<32>, BL<64> and BL<96> were all going to be SET to the low resistance state. In the example of FIG. 12, the memory cells connected to BL<0> and BL<32> will be SET to the low resistance state; however, the memory cell connected to BL<64> will not be SET to the low resistance state. For example, when storing data some bits will remain at data 0 while others will be programmed to data 1 to accommodate the particular file being stored.

Because the memory cells associated with column 2 will not be SET to the low resistance state, at t3, SAEN is lowered down to 0 to indicate that no data should be programmed. The column address COL<5:0> is still selecting column 2 because one or more of the other 15 memory cells for that column may need to be SET. The appropriate CSEL<2> will be toggled to logic 1. However, SELB<0> and GSELB<0> may be fully or partially discharged because SAEN is at logic 0. As such, BL<64> will remain at VUB.

At t4, the column address changes to column 3 and SAEN will rise shortly after that to indicate that the next bit should be programmed. In response to SAEN rising to logic 1, CSEL<3> will be toggled to logic 1, which causes BL<96> to be in communication with GSELB<0> and SELB<0>. As a result BL<96> will be charged to VWR. When the column address changes, BL<96> will eventually be cut off from the local and global data lines GSELB<0> and SELB<0>. This process will continue until the last column has its appropriate bit lines charged up. For example, time t6 represents a time when all columns have been operated on. Those bit lines that have memory cells to be SET will be charged up to VWR. Those bit lines which are connected to memory cells that should not be SET will have their bit lines VUB. At time t6, none of the bit lines that are charged will be able to dissipate through a memory cell because the selected word line is at VWR-DV. At time t7, the selected word line is lowered to Vss, which provides an opportunity for the bit lines to be discharged through the memory cells, to the word line. As can be seen in FIG. 12, shortly after time t7 the bit lines are discharged. Although FIG. 12 shows the bit lines being discharged at the same time, it is likely that, due to variations in process (and other variables), memory cells may complete the SET operation at different points in time. However, t7 is when each of the memory cells are concurrently provided a discharge path.

Note that although the above description of FIG. 12 describes a SET operation being performed, the process of FIG. 12 can also be used to perform a RESET operation. When performing a RESET operation, VWR will be at Vreset.

Figure 13:
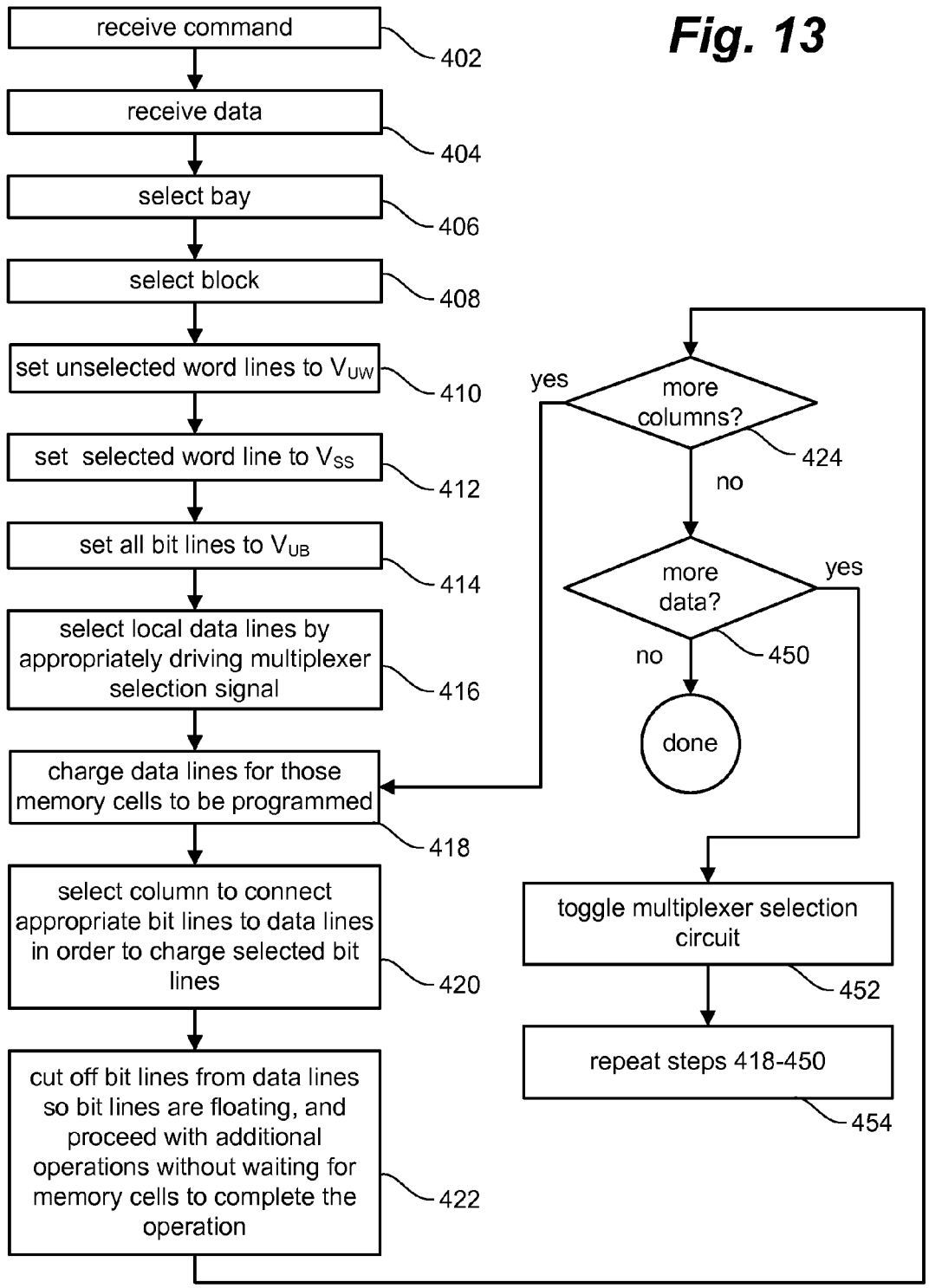
FIG. 13 is a flow chart describing a second set of embodiments of a process for operating the data lines and selection circuits.

FIG. 13 is a flow chart that describes a second set of embodiments. The second set of embodiments use the capacitive discharge method of programming and includes loading data for up to all of the columns in a block, then switching the selection signal S for the multiplexers and loading data again for the up to all of the columns for the same block (this time pointing to the other local data line SELB). In this case, DSG_MODE is set to 0, and CELN<Z> is set to 0 for the selected columns. In this second set of embodiments, the number of memory cells programmed simultaneously is (the number of columns)*(the number of sense amplifiers)*(the number of local-to-global data lines multiplexers inputs).

Steps 402-424 of FIG. 13 are the same as in FIG. 10. After step 424 determines that all of the columns have been loaded, then it is determined whether there is more data to be programmed (step 450). If not, the process is complete. If there is more data to be programmed, then in step 452 the multiplexer selection signal S is toggled so that the other set of local data lines SELB is selected. For example, if the even SELB lines were just loaded, then S is toggled to select the odd SELB lines. Other arrangements of local data lines can also be used. After the signal S is toggled, the process continues at step 454 so that the data lines are again charged and steps 418-450 are repeated. Note that differently from FIG. 10, bitlines are not discharged before toggling the multiplexer selection circuits, thus allowing more bits to be programmed in parallel than the embodiment described in FIG. 10. Note that steps 418-454 can be implemented based on the timing diagrams of FIG. 11 or 12. In case of FIG. 12, step 414 is postponed till all data has been precharged on the bitlines (e.g. after step 454)

As can be seen, the second set of embodiments starts the programming process for the memory cells connectable to the second set of local data lines (e.g., odd numbered SELB) without waiting for the completion of programming for the memory cells connectable to the first set of local data lines (e.g., even numbered SELB).

A third set of embodiments includes preparing the data on both local data lines connected to a multiplexer, without switching columns. The column address is fixed to a specific address and DSG_MODE is set to 0. CELN<Z> (or CELN_odd<Z> or CELN_even<Z>) is set to 1 for unselected bit lines and CELN<Z> (or CELN_odd<Z> or CELN_even<Z>) is set to 0 for selected bit lines. The data for one local data line is loaded, the multiplexer selection signal S is toggled, and the data for the other local data line is loaded. After the data is loaded for both local data lines, the system waits for programming to complete for both sets of local data lines. After programming completes for both sets of local data lines, the column address is changed. In this set of embodiments, the number of memory cells programmed concurrently includes (number of sense amplifiers)*(the number of local-to-global data lines multiplexers inputs).

Figure 14:
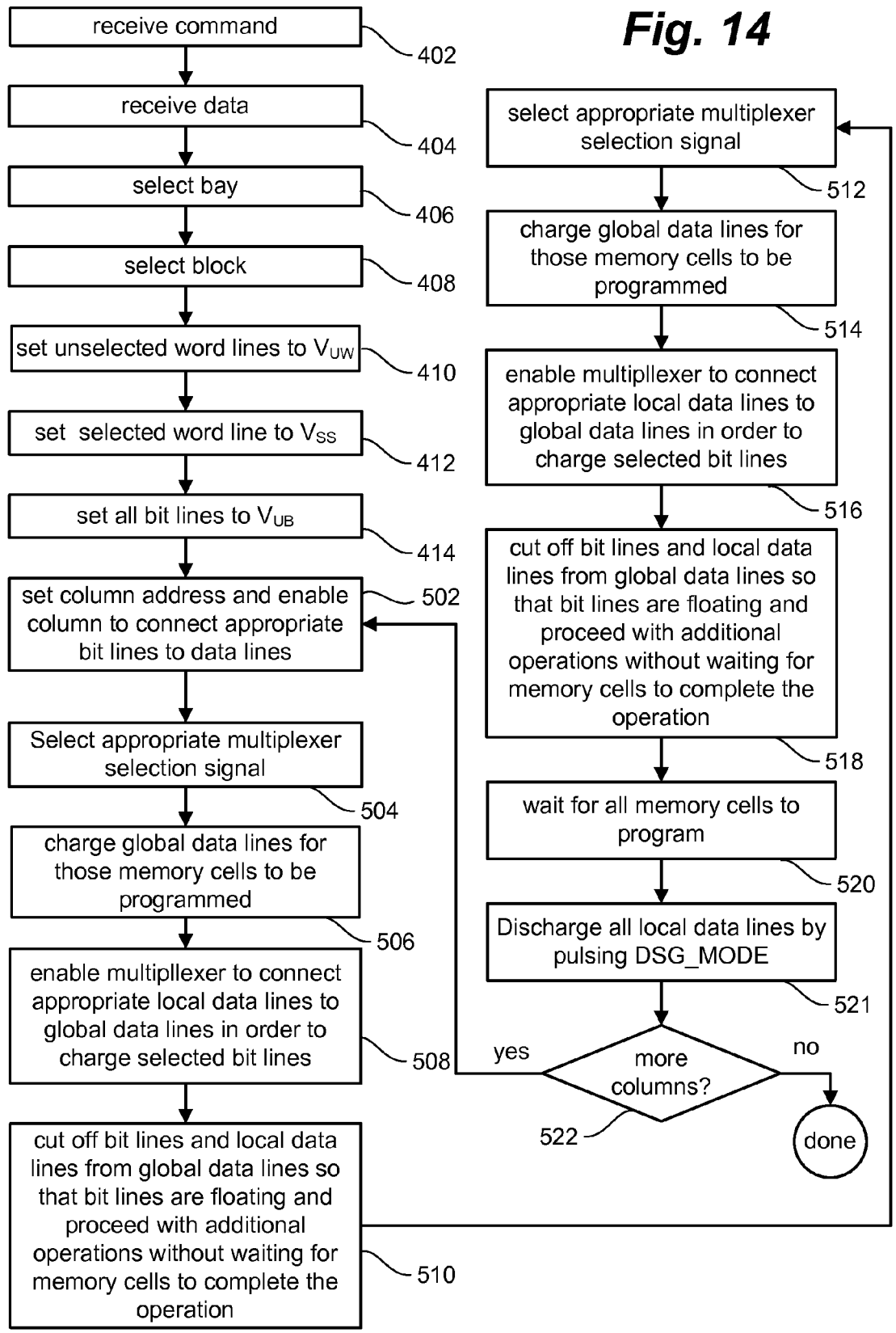
FIG. 14 is a flow chart describing a third set of embodiments of a process for operating the data lines and selection circuits.

FIG. 14 is a flow chart describing the operation of the third set of embodiments. Steps 402-414 of FIG. 14 are the same as in FIG. 10. In step 502, the column address (COL<5:0>) is set. During the same step, the addressed column of the block is enabled by asserting the appropriate bit of CSEL<63:0>. Thus, the bit lines for that column will be connected to the local data lines (via the circuit of FIG. 8, 8A or 8B). In step 504, the multiplexers MUX (see FIGS. 7 and 9) are configured to select the appropriate local data lines SELB by setting the multiplexer selection signal S to the appropriate value. In step 506, the sense amplifiers will charge the global data lines by applying a voltage to the global data lines. In this case, the signal MUX_EN is kept at 0, and the global data lines are not connected to the local data lines, The charging of the global data lines is data dependent. That is, the system only charges a data line if the memory cell to be connected to that data line is to be programmed. If the memory cell is not to be programmed, then the associated data line is not charged in step 506. In step 508, the multiplexer is enabled by asserting signal MUX_EN, thereby connecting the global data lines GSELB to local data lines SELB and bit lines. Thus, the bit lines for that column will be connected to the local and global data lines (via the circuit of FIG. 8, 8A or 8B and 9) so that the charge in the global data lines will be shared with the bit lines, and the bit lines will be charged up. At step 510, after charge sharing is completed, the bitlines and the local data lines will be cut off from the global data lines by de-asserting the MUX_EN signal, so that the bit lines and local data lines are floating. The act of cutting off the bit lines and the local data lines from the global data lines will be performed while the bit lines are charged and without waiting for the program operations for the memory cells connected to the bit lines to complete. In some embodiments, the system will not check to determine whether the programming operations are completed. Rather, the bit lines will be cut off and the system will proceed with additional programming operations without waiting for the memory cells to complete the programming operation.

In step 512 of FIG. 14, the selection of the local data lines to be connected to the global data lines is changed by toggling the multiplexer selection signal S. In step 514, the sense amplifiers will charge the global data lines by applying a voltage to the global data lines. In step 516, charge sharing is enabled by asserting the MUX_EN signal. Thus, the bit lines for that column and the local data lines will be connected to the global data lines (via the circuit of FIG. 8, 8A or 8B and 9) so that the charge in the data lines will be shared with the bit lines, and the bit lines will be charged up. In step 518, the charged bit lines and local data lines will be cut off from the global data lines so that the bit lines are floating. In this manner, memory cells connected to multiple local data lines for the same multiplexer may experience programming concurrently, even if they start and finish programming at the same time because their respective programming processes overlap. In step 520, the system will wait for the programming operations to complete. That is, up to sixteen memory cells connected to odd local data lines (SELB) and up to sixteen memory cells connected to even local data lines (SELB) are concurrently being programmed. The system can test to see if the programming has completed, or the system can wait a predetermined amount of time that it knows is more than enough time to complete programming. In some embodiments, DSG_MODE can be pulsed to 1 in order to discharge all local data lines (step 521).

If there are no more columns to program (step 522), then the process of FIG. 14 is completed. If there are more columns to program (step 522), then the process continues at step 502, a new column address is set and steps 506-521 are repeated for the new column address. Steps 506-521 are repeated for each column to be programmed. In this set of embodiments, memory cells for both local data lines connected to a multiplexer can be programmed concurrently. However, the system waits between columns so that memory cells in different columns are not programmed concurrently.

Figure 15:
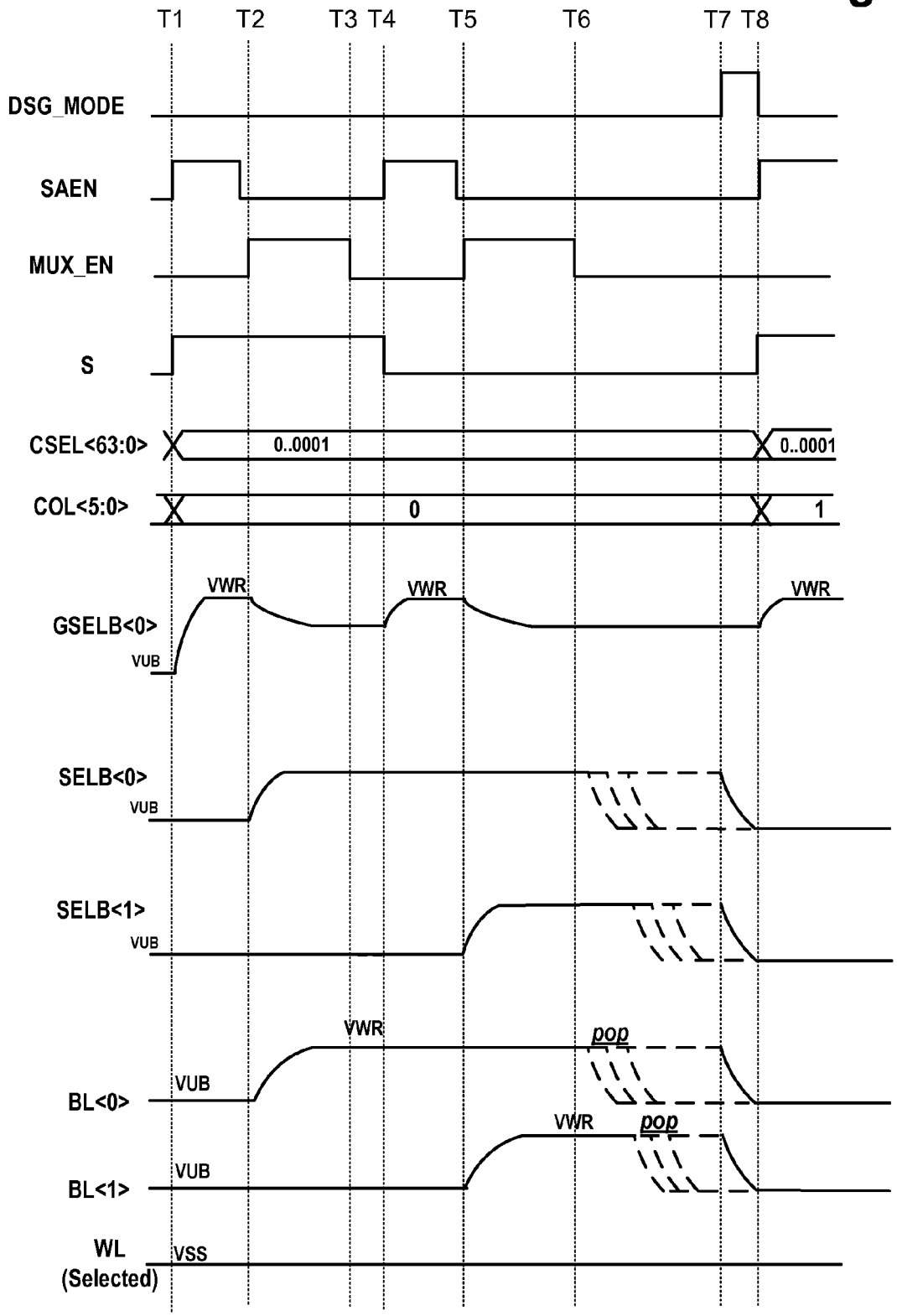
FIG. 15 is a timing diagram providing details of a programming process.

FIG. 15 is a timing diagram that explains a portion of the process of FIG. 14. FIG. 15 shows DSG_MODE, SAEN, MUX_EN, S, CSEL<63:0>, COL<5:0>, GSELB<0>, SELB<0>, SELB<1>, BL<0>, BL<1>, and WL (Selected). BL<0> and BL<1> are in the same column. BL<0> is connectable to SELB<0>. BL<1> is connectable to SELB<1>. GSELB<0>, SELB<0>, SELB<1>, BL<0>, and BL<1> start out at VUB. SAEN, DSG_MODE, MUX_EN, S, CSEL<63:0>, and WL start at VSS. At time T1, SAEN is pulsed high and the sense amplifier charges GSELB<0>. Additionally, the column address for column 0 is driven on COL<5:0>. Time T1 corresponds to steps 502, 504 and 506 of FIG. 14. At time T2, MUX_EN changes from 0 to 1, corresponding to step 508 of FIG. 14. As a result, line BL<0> and SELB<0> receives charge from GSELB<0>. In this manner, the sense amplifier, GSELB,0> all serve as a source of charge for SELB<0> and BL<0>. At time T3, MUX_EN is de-asserted, which cuts off the bit line BL<0> and SELB<0> from GSEBL<0> (see step 510 of FIG. 14). At time T4 (corresponding to the rising edge of the second pulse on SAEN), the multiplexer selection signal S is set low to select SELB<1> for connection to GSELB<0>, corresponding to step 512 of FIG. 14. Additionally, the sense amplifier charges GSELB<0>, corresponding to step 514. At time T5, MUX_EN is asserted, corresponding to step 516 of FIG. 14. As a result, line BL<1> and SELB<1> receives charge from GSELB<0>. At time T6, MUX_EN is de-asserted, which cuts off the bit line BL<1> and SELB<1> from GSELB<0> (see step 518 of FIG. 14). Between T6 and T7, the system waits for the memory cells connected to BL<0> and BL<1> to complete programming (pop), corresponding to step 520 of FIG. 14. At time T7, DSG_MODE is pulsed high to remove all remaining charge from SELB<0> and SELB<1> before connecting the newly selected column, corresponding to step 521 of FIG. 14. This, process will then be repeated for the next column starting at time T8. Note that FIG. 15 shows the memory cells connected to BL<0> and BL<1> completing the SET operation (POP). However, the exact timing of the completion of the SET operation will vary.

Note that the amount of time it takes a memory cell will to complete programming will vary. FIG. 15 shows the memory cell on BL<1> programming in less time than the memory cell on BL<0>. However, it is possible that the memory cell on BL<0> programs in less time than the memory cell on BL<1>.

The timing diagram of FIG. 15 shows the selected word line at VSS so that each memory cell (although programming concurrently at some point in time) may complete its programming on its own time frame. For example, the memory cells connected to BL<0> and BL<1> are concurrently programming between T5 and T6; however, the memory cell on BL<0> started programming before and completed programming after the memory cell connected to BL<1>. An alternative is to synchronize the completion of the programming by using the technique of FIG. 12 to hold the selected word line at a high voltage until the time for the groups of memory cells to program at the same time.

Looking back at FIG. 14, the system waits between program operations for each column. In a fourth set of embodiments, the system will not wait between program operations for each column. Rather, after starting the programming operations for one column, the system will change the column address and start the programming operations for the next column without waiting. Thus, step 520 of FIG. 14 will be skipped and the unselected bit lines will not be discharged between operating on columns. This will require adopting a scheme similar to the one described in FIG. 13 as multiple columns are programmed simultaneously.

One feature common to the various embodiments is that the number of memory cells being concurrently programmed is greater than the number of sense amplifiers. Such a scheme provides an improvement in performance.

The continuous programming technology described above can be used with many different architectures and is not limited to the architectures disclosed herein. For example, the continuous programming technology described above can be used with the architecture described in U.S. patent application Ser. No. 12/410,648 "Memory System With Sectional Data Lines," Tianhong Yan; Luca Fasoli filed on Mar. 25, 2009 and the architecture described in U.S. patent application Ser. No. 12/563,139 "Memory System With Data Line Switching Scheme," Tianhong Yan and Luca Fasoli, filed on the same day as the present application. Both of these patent applications are incorporated herein by reference in their entirety.

One embodiment that includes the above described technology comprises selecting a first set of non-volatile storage elements, starting a program operation for the first set of non-volatile storage elements, unselecting the first set of non-volatile storage elements and selecting a second set of non-volatile storage elements after starting the program operation for the first set of non-volatile storage elements and without waiting for completion of the program operation for the first set of non-volatile storage elements, and starting a program operation for the second set of non-volatile storage elements without waiting for completion of the program operation for the first set of non-volatile storage elements. In one example, the unselecting of the first set of non-volatile storage elements, the selecting the second set of non-volatile storage elements and the starting the program operation for the second set of non-volatile storage elements are performed without checking to see if the first set of non-volatile storage elements experienced a state change and without checking to see if the first set of non-volatile storage elements experienced a state change.

One embodiment includes a plurality of non-volatile storage elements including a first set of non-volatile storage elements and a second set of non-volatile storage elements, a set of signal driving circuits, and selection circuitry. The selection circuitry selectively connects either the first set of non-volatile storage elements to the set of signal driving circuits or the second set of non-volatile storage elements to the set of signal driving circuits. The set of signal driving circuits start a program operation for the first set of non-volatile storage elements while the selection circuitry connects the first set of non-volatile storage elements to the set of signal driving circuits. The selection circuitry disconnects the first set of non-volatile storage elements from the set of signal driving circuits and connects the second set of non-volatile storage elements to the set of signal driving circuits after starting the program operation for the first set of non-volatile storage elements and without waiting for completion of the program operation for the first set of non-volatile storage elements. The set of signal driving circuits start a program operation for the second set of non-volatile storage elements while the selection circuitry connects the second set of non-volatile storage elements to the set of signal driving circuits without waiting for completion of the program operation for the first set of non-volatile storage element.

One embodiment includes a first non-volatile storage element, a first control line connected to the first non-volatile storage element, a second non-volatile storage element, a second control line connected to the second non-volatile storage element, a data line, a signal driving circuit in communication with the data line, the signal driving circuitry charges the data line and selection circuitry connected to the first control line, the second control line and the data line. The data line transfers charge to the first control line while the selection circuitry connects the data line to the first control line. The selection circuitry disconnects the data line from the first control line while the first control line is charged from the data line and connects the data line to the second control line. The data line transfers charge to the second control line while the selection circuitry connects the data line to the second control line.

One embodiment includes connecting a charge source to a first control line that is connected to a first non-volatile storage element, charging the first control line based on the charge source while the charge source is connected to the first control line, disconnecting the charge source from the first control line while the first control line remains charged from the charge source, connecting the charge source to a second control line, the second control line is connected to a second non-volatile storage element, charging the second control line based on the charge source while the charge source is connected to the second control line, and disconnecting the charge source from the second control line.

One embodiment includes applying a first charge from a first set of signal drivers to a first set of control lines that are connected to a first set of non-volatile storage elements for a first period of time that is insufficient to change the first set of non-volatile storage elements from a first predetermined state to a second predetermined state, (after the first period of time) allowing the first set of control lines to discharge the first charge through the first set of non-volatile storage elements in order to change the first set of non-volatile storage element from the first predetermined state to the second predetermined state, applying a second charge from the first set of signal drivers to a second set of control lines that are connected to a second set of non-volatile storage element for a second period of time that is insufficient to change the second set of non-volatile storage elements from the first predetermined state to the second predetermined state, and (after the second period of time) allowing the second set of control lines to discharge the second charge through the second set of non-volatile storage elements in order to change the second set of non-volatile storage element from the first predetermined state to the second predetermined state. The applying the second charge to the second set of control lines is started while at least a subset of the first set of control lines still have the first charge.

One embodiment includes a plurality of non-volatile storage elements, control lines in communication with the non-volatile storage elements, local data lines, global data lines, a plurality of first selection circuits, a plurality of second selection circuits, and control circuits in communication with the global data lines. The first selection circuits selectively connect a subset of the control lines to the local data lines. The first selections circuits each include a first switch and a second switch. The first switch selectively connects a respective control line to a respective local data line. The second switch selectively connects the respective control line to an unselected control line signal. The second switch is controlled independently from the first switch. The second selection circuits selectively electrically connect a subset of the local data lines to the global data lines.

One embodiment includes a plurality of non-volatile storage elements, a set of signal lines connected to the non-volatile storage elements, a set of sense amplifiers, a plurality of selection circuits for selectively causing a subset of control lines to be in communication with the sense amplifiers, and control circuitry in communication with the selection circuits and the sense amplifiers. The control circuitry communicates with the selection circuits and the sense amplifiers to cause a subset of the non-volatile storage elements to concurrently experience programming in response to the set of sense amplifiers. The number of non-volatile storage elements in the subset of the non-volatile storage elements that concurrently experience programming in response to the set of sense amplifiers is greater than the number of sense amplifiers in the set of sense amplifiers.

One embodiment includes means for selecting a first set of non-volatile storage elements, means for starting a program operation for the first set of non-volatile storage elements, means for unselecting the first set of non-volatile storage elements and selecting a second set of non-volatile storage elements after starting the program operation for the first set of non-volatile storage elements and without waiting for completion of the program operation for the first set of non-volatile storage elements; and means for starting a program operation for the second set of non-volatile storage elements without waiting for completion of the program operation for the first set of non-volatile storage elements.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage apparatus, comprising:
a monolithic three-dimensional memory array including a first non-volatile storage element and a second non-volatile storage element; and
one or more control circuits in communication with the first non-volatile storage element and the second non-volatile storage element, the one or more control circuits perform and complete a program operation for the first non-volatile storage element using a first source of charge by connecting a control line for the first non-volatile storage element to the first source of charge at a first time, the one or more control circuits perform and complete a program operation for the second non-volatile storage element using the first source of charge by connecting a control line for the second non-volatile storage element to the first source of charge at a second time that is subsequent to the first time, the program operation for the first non-volatile storage element of the monolithic three-dimensional memory array is performed concurrently with the program operation for the second non-volatile storage element of the monolithic three-dimensional memory array.

2. The non-volatile storage apparatus of claim 1, wherein:
the first non-volatile storage element includes a first reversible resistance-switching memory element; and
the second non-volatile storage element includes a second reversible resistance-switching memory element.

3. The non-volatile storage apparatus of claim 1, wherein:
the program operation for the first non-volatile storage element and the program operation for the second non-volatile storage element both include discharging to a common control line.

4. The non-volatile storage apparatus of claim 1, wherein:
the one or more control circuits start the program operation for the first non-volatile storage element by applying a charge on the control line for the first non-volatile storage element; and
the one or more control circuits unselect the first non-volatile storage element, select the second non-volatile storage element and start the program operation for the second non-volatile storage element while the first control line still holds at least a portion of the charge.

5. The non-volatile storage apparatus of claim 1, wherein:
the one or more control circuits start the program operation for the first non-volatile storage element by applying a charge on the control line for the first non-volatile storage element for a period of time that is insufficient to change the first non-volatile storage element from a first predetermined state to a second predetermined state;
the one or more control circuits start the program operation for the second non-volatile storage element by applying a charge on the second control line for a period of time that is insufficient to change the second non-volatile storage element from the first predetermined state to the second predetermined state; and
the one or more control circuits allow the first control line to discharge through the first non-volatile storage element in order to change the first non-volatile storage element from the first predetermined state to the second predetermined state and the one or more control circuits allow the second control line to discharge through the second non-volatile storage element in order to change the second non-volatile storage element from the first predetermined state to the second predetermined state.

6. A process for programming non-volatile storage, comprising:
performing and completing a program operation for a first non-volatile storage element of a monolithic three-dimensional memory using a first source of charge by connecting a control line for the first non-volatile storage element to the first source of charge at a first time;
performing and completing a program operation for a second non-volatile storage element of the monolithic three-dimensional memory using the first source of charge by connecting a control line for the second non-volatile storage element to the first source of charge at a second time that is subsequent to the first time, the program operation for the first non-volatile storage element of the monolithic three-dimensional memory is performed concurrently with the program operation for the second non-volatile storage element of the monolithic three-dimensional memory.

7. The method of claim 6, wherein:
the first non-volatile storage element includes a first reversible resistance-switching memory element; and
the second non-volatile storage element includes a second reversible resistance-switching memory element.

8. The method of claim 6, wherein:
the program operation for the first non-volatile storage element and the program operation for the second non-volatile storage element both include discharging to a common control line.

9. The method of claim 6, wherein:
the program operation for the first non-volatile storage element is started by applying a charge on the control line for the first non-volatile storage element; and
one or more control circuits for the monolithic three-dimensional memory unselect the first non-volatile storage element, select the second non-volatile storage element and start the program operation for the second non-volatile storage element while the first control line still holds at least a portion of the charge.

10. The method of claim 6, wherein:
one or more control circuits for the monolithic three-dimensional memory start the program operation for the first non-volatile storage element by applying a charge on the control line for the first non-volatile storage element for a period of time that is insufficient to change the first non-volatile storage element from a first predetermined state to a second predetermined state;
the one or more control circuits start the program operation for the second non-volatile storage element by applying a charge on the second control line for a period of time that is insufficient to change the second non-volatile storage element from the first predetermined state to the second predetermined state; and
the one or more control circuits allow the first control line to discharge through the first non-volatile storage element in order to change the first non-volatile storage element from the first predetermined state to the second predetermined state and the one or more control circuits allow the second control line to discharge through the second non-volatile storage element in order to change the second non-volatile storage element from the first predetermined state to the second predetermined state.

11. The method of claim 6, wherein:
the program operation for the first non-volatile storage element includes changing a resistance of the first non-volatile storage element while the first non-volatile storage element is not in communication with the first source of charge; and
the program operation for the second non-volatile storage element includes changing a resistance of the second non-volatile storage element while the second non-volatile storage element is not in communication with the first source of charge.

12. A method of programming non-volatile storage, comprising:
connecting control lines for a first set of non-volatile storage elements to a set of charge sources;
performing a program operation for the first set of non-volatile storage elements in response to the charge sources;
connecting control lines for a second set of non-volatile storage elements to the set of charge sources; and
performing a program operation for the second set of non-volatile storage elements in response to the charge sources, the program operation for the first set of non-volatile storage elements is performed concurrently with the program operation for the second set of non-volatile storage elements, the number of non-volatile storage elements of the first set and the second set that concurrently experience programming in response to the set of charge sources is greater than the number of the charge sources.

13. The method of claim 12, wherein:
the control lines for the second set of non-volatile storage elements are connected to the set of charge sources while the control lines for the first set of non-volatile storage elements are not connected to the charge sources.

14. The method of claim 12, wherein:
the first set of non-volatile storage elements include reversible resistance-switching memory elements; and
the second set of non-volatile storage elements include reversible resistance-switching memory elements.

15. The method of claim 12, wherein:
the performing the program operation for the first set of non-volatile storage elements includes applying charges on the control lines for the first set of non-volatile storage elements and allowing the charges to dissipate though the first set of non-volatile storage elements; and
the performing the program operation for the second set of non-volatile storage elements includes applying charges on the control line for the second set of non-volatile storage elements and allowing the charges to dissipate though the second set of non-volatile storage elements.

16. The method of claim 12, wherein:
the performing the program operation for the first set of non-volatile storage elements includes applying charges on the control lines for the first set of non-volatile storage elements and allowing the charges to dissipate though the first set of non-volatile storage elements; and
the performing the program operation for the second set of non-volatile storage elements is commenced while the control lines for the first set of non-volatile storage elements still hold at least a portion of the charges.

17. The method of claim 12, wherein:
the performing the program operation for the first set of non-volatile storage elements includes applying charges on the control lines for the first set of non-volatile storage elements for a period of time that is insufficient to change the first set of non-volatile storage elements from a first predetermined state to a second predetermined state;
the performing the program operation for the second set of non-volatile storage elements includes applying charges on the control lines for the second set of non-volatile storage elements for a period of time that is insufficient to change the second set of non-volatile storage elements from the first predetermined state to the second predetermined state; and
the method further includes allowing the control lines for the first set of non-volatile storage elements to discharge through the first set of non-volatile storage elements in order to change the first set of non-volatile storage element from the first predetermined state to the second predetermined state and allowing the control lines for the second set of non-volatile storage elements to discharge through the second set of non-volatile storage elements in order to change the second set of non-volatile storage element from the first predetermined state to the second predetermined state.

18. The method of claim 17, wherein:
the control lines for the first set of non-volatile storage elements discharge through the first set of non-volatile storage elements to a word line; and
the control lines for the second set of non-volatile storage elements discharge through the second set of non-volatile storage elements to the word line.

\* \* \* \* \*